(12) United States Patent
Takahashi

(10) Patent No.: US 10,734,091 B2
(45) Date of Patent: Aug. 4, 2020

(54) MEMORY SYSTEM

(71) Applicant: TOSHIBA MEMORY CORPORATION, Tokyo (JP)

(72) Inventor: Eietsu Takahashi, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 56 days.

(21) Appl. No.: 16/109,343

(22) Filed: Aug. 22, 2018

(65) Prior Publication Data

US 2019/0287640 A1    Sep. 19, 2019

(30) Foreign Application Priority Data

Mar. 16, 2018 (JP) .................... 2018-049703

(51) Int. Cl.
| | |
|---|---|
| *G11C 29/42* | (2006.01) |
| *G06F 11/10* | (2006.01) |
| *H03M 13/11* | (2006.01) |
| *G11C 29/52* | (2006.01) |
| *H03M 13/15* | (2006.01) |
| *G11C 29/44* | (2006.01) |

(52) U.S. Cl.
CPC ............ *G11C 29/42* (2013.01); *G06F 11/106* (2013.01); *G06F 11/1068* (2013.01); *G11C 29/44* (2013.01); *G11C 29/52* (2013.01); *H03M 13/1108* (2013.01); *H03M 13/152* (2013.01)

(58) Field of Classification Search
CPC ......... G11C 29/42; G11C 29/52; G11C 29/44; G06F 11/1068; G06F 11/106; H03M 13/1108; H03M 13/152
See application file for complete search history.

(56) References Cited

U.S. PATENT DOCUMENTS

| | | | |
|---|---|---|---|
| 8,958,247 B2 | 2/2015 | Asaoka et al. | |
| 9,954,558 B1* | 4/2018 | Steiner | H03M 13/3784 |
| 2012/0268994 A1* | 10/2012 | Nagashima | G06F 11/1048 |
| | | | 365/185.11 |
| 2015/0261604 A1* | 9/2015 | Sugiyama | G11C 29/52 |
| | | | 714/764 |
| 2016/0232985 A1 | 8/2016 | Sabde et al. | |
| 2016/0239381 A1* | 8/2016 | Nakazumi | G06F 11/1072 |

FOREIGN PATENT DOCUMENTS

JP       2009-271852 A     11/2009

* cited by examiner

*Primary Examiner* — Thien Nguyen
(74) *Attorney, Agent, or Firm* — Kim & Stewart LLP

(57) ABSTRACT

A memory system includes a nonvolatile memory which includes a memory cell array, and a memory controller which includes a first ECC circuit, and a second ECC circuit having an error correction capability higher than that of the first ECC circuit, and is configured to perform ECC operation on data read from the nonvolatile memory using the first ECC circuit and the ECC circuit. During the ECC operation, the first ECC circuit corrects an error in first read data which is read out of the nonvolatile memory. The memory controller determines whether the hard error occurs in the memory cell array in a case where the first ECC circuit is unable to correct the error. In a case where the hard error occurs, the second ECC circuit performs error correction using second read data that excludes a bit where the hard error occurs.

18 Claims, 18 Drawing Sheets

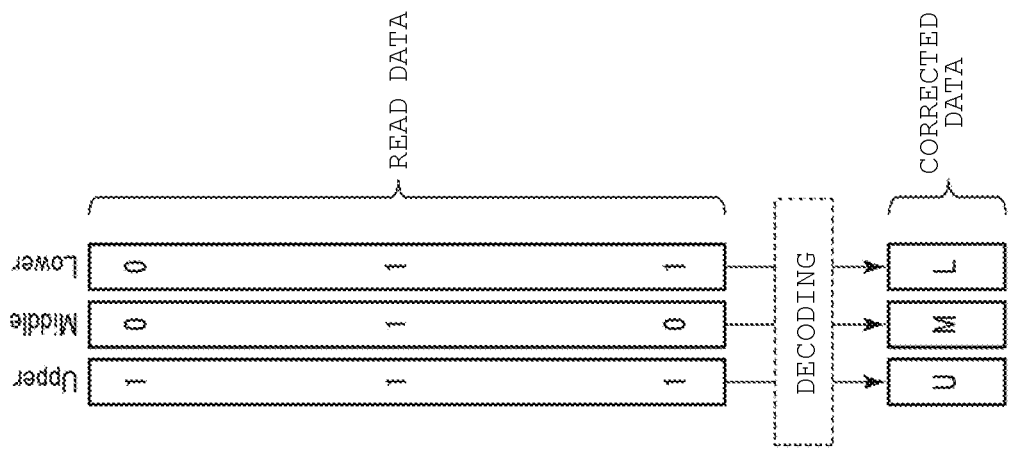
FIG. 16
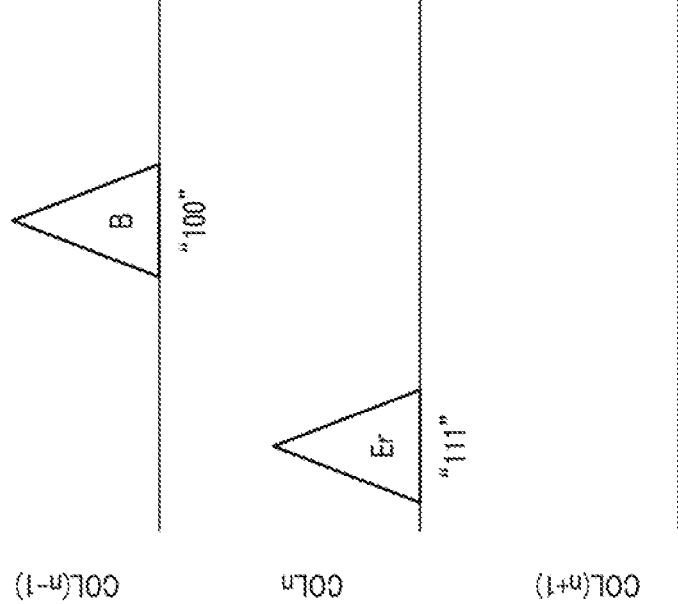

MEMORY SYSTEM

CROSS-REFERENCE TO RELATED APPLICATIONS

This application is based upon and claims the benefit of priority from Japanese Patent Application No. 2018-049703, filed Mar. 16, 2018, the entire contents of which are incorporated herein by reference.

FIELD

An embodiment described herein relates generally to a memory system which includes a nonvolatile memory.

BACKGROUND

A NAND flash memory which includes a plurality of memory cells stacked in three dimensions is known as a type of a nonvolatile memory.

The NAND flash memory is configured such that the plurality of memory cells are connected to one bit line. Therefore, a read failure may be caused by an influence of some memory cells among the plurality of connected memory cells. The NAND flash memory reduces such a readout failure by using an ECC circuit. In the ECC circuit, an LDPC (Low-Density Parity Check) technique is employed in which an error correction capability is extremely high. In the LDPC correction, an LLR (log likelihood ratio) value used in decoding is dynamically changed between "0" and "1" and, a probability distribution thereof is used. Therefore, data having an accurate probability distribution can be corrected with high performance.

The LDPC technique has an extremely high error correction capability. On the other hand, the correction performance is significantly reduced by a hard bit error (HBE) which causes a large deviation in the probability distribution used in the LDPC technique. Therefore, there is a need to establish a system that accounts for the HBE.

DESCRIPTION OF THE DRAWINGS

FIG. 16 is a schematic diagram for describing an example of a BCH correction;

DETAILED DESCRIPTION

An embodiment provides a memory system which can prevent error correction efficiency from being reduced.

In general, according to one embodiment, a memory system is provided with a nonvolatile memory which includes a memory cell array, and a memory controller which includes a first Error Checking and Correcting (ECC) circuit and a second ECC circuit having a higher error correction capability than the first ECC circuit, and is configured to perform ECC operation on data read from the nonvolatile memory using the first ECC circuit and the ECC circuit. During the ECC operation, the first ECC circuit corrects an error in first read data which is read out of the nonvolatile memory. In a case where the first ECC circuit is unable to correct an error, the memory controller determines whether the hard error occurs in the memory cell array. In a case where the hard error occurs, the second ECC circuit performs an error correction using second read data that excludes a bit where the hard error occurs.

Hereinafter, the embodiments will be described with reference to the drawings. The following description specify devices and methods that embody technical ideas of the present disclosure, but the technical ideas of the present disclosure are not limited to such devices and method and shapes of the components, structures, and layouts of the devices. The respective functional blocks may be realized by hardware and software, or by a combination thereof. The respective functional blocks are not necessarily distinct as in the following examples. For example, a part of the functions may be executed by another functional block separated from the functional blocks of the examples. Further, the functional blocks of the examples may be divided into functional sub-blocks. Further, in the following description, elements having the same function and configuration will be given the same symbol, and redundant descriptions thereof will be given as needed.

[1] Configuration of Memory System 1

Figure 1:
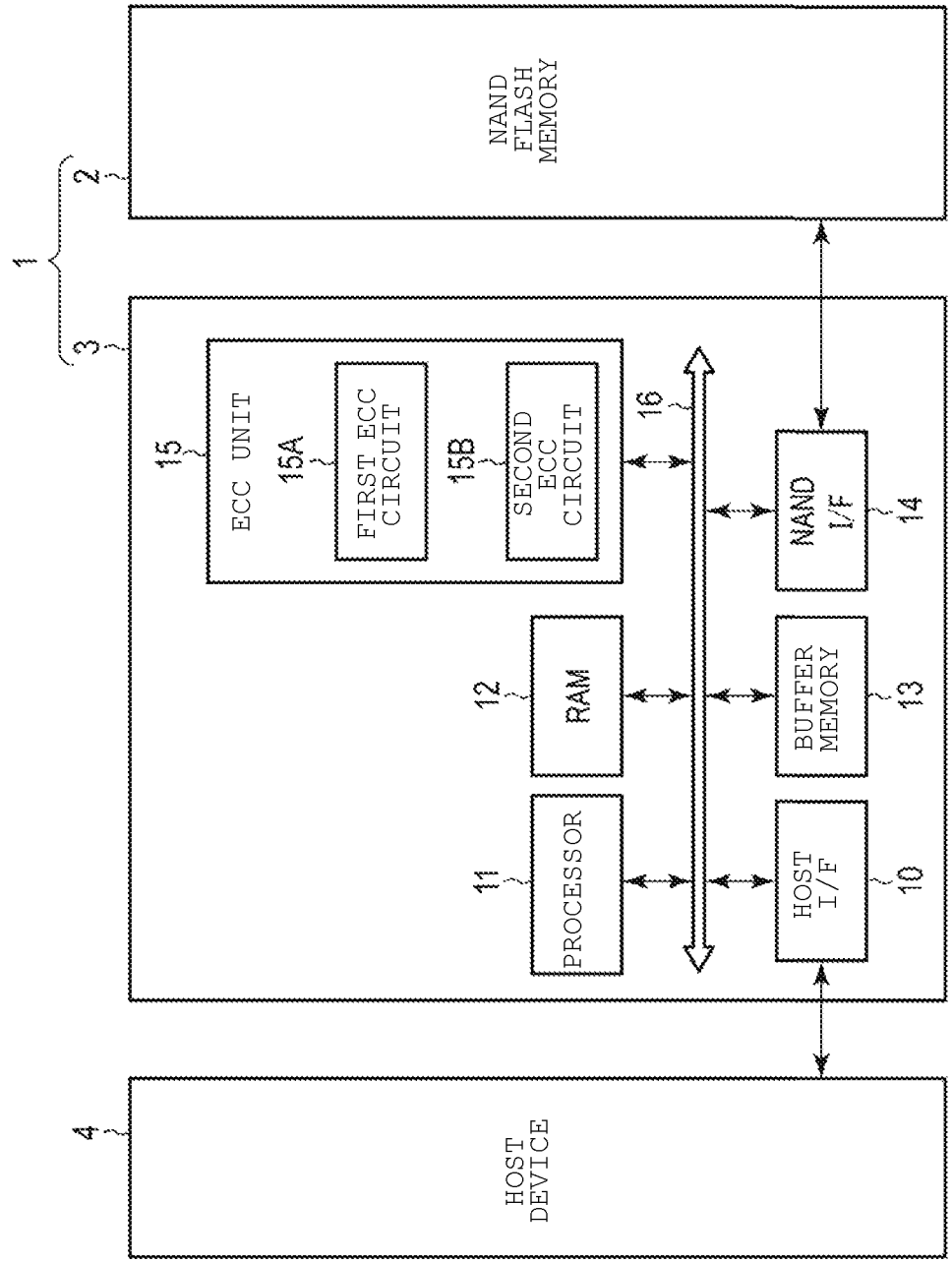
FIG. 1 is a block diagram of a memory system according to an embodiment.

FIG. 1 is a block diagram of the memory system 1 according to an embodiment. The memory system 1 includes a NAND flash memory 2 and a memory controller 3.

The memory system 1 may be implemented by mounting a plurality of chips which forms the memory system 1 on a mother board that is mounted in a host device. The memory system 1 may be configured as a system LSI (large-scale integrated circuit) which implements the memory system 1 in one module or a SoC (system on chip). As an example of the memory system 1, there is a memory card such as an SD™ card, an SSD (solid state drive), and an eMMC (embedded multimedia card).

The NAND flash memory 2 includes a plurality of memory cells, and stores data in a nonvolatile manner. A specific configuration of the NAND flash memory 2 will be described below.

The memory controller 3 issues a command such as write command, read command, and erase command to the NAND flash memory 2, for example, in response to a command from a host device 4. In addition, the memory controller 3 manages a memory space of the NAND flash memory 2. The memory controller 3 includes a host interface circuit (host I/F) 10, a processor 11, a RAM (Random Access Memory) 12, a buffer memory 13, a NAND interface circuit (NAND I/F) 14, and an ECC (Error Checking and Correcting) unit 15. These modules are connected to each other via a bus 16.

The host interface circuit 10 is connected to the host device 4 via a host bus, and performs an interface process with respect to the host device 4. In addition, the host interface circuit 10 transfers and receives commands, addresses, and data with respect to the host device 4.

The processor 11 is a CPU (Central Processing Unit) for example. The processor 11 controls the entire operation of the memory controller 3. For example, in a case where a write command is received from the host device 4, the processor 11 issues the write command to the NAND flash memory 2 through the NAND interface 14 in response. The operation is the same in the case of the read and erasing operations. In addition, the processor 11 executes various processes to manage the NAND flash memory 2 such as wear leveling.

The RAM 12 is used as a work area of the processor 11, and stores firmware retrieved from the NAND flash memory 2 and various types of tables created by the processor 11. The RAM 12 is a DRAM in one example. The buffer memory 13 temporally stores data transferred from the host device 4, and temporally stores data transferred from the NAND flash memory 2.

When writing data, the ECC unit 15 generates an error correction code with respect to the write data, and sends the error correction code attached to the write data toward the NAND interface circuit 14. In addition, when reading data, the ECC unit 15 performs error detection and error correction, on the read data using the error correction code included in the read data. Further, the ECC unit 15 may be provided in the NAND interface circuit 14.

The ECC unit 15 is a circuit that includes a first ECC circuit 15A and a second ECC circuit 15B. In other words, in this embodiment, the memory controller 3 is provided with two types of ECC circuits. The first ECC circuit 15A and the second ECC circuit 15B are different in the error correction capability. The error correction capability of the second ECC circuit 15B is higher than the error correction capability of the first ECC circuit 15A. The first ECC circuit 15A performs the error correction using a BCH (Bose-Chaudhuri-Hocquenghem) code for example. The second ECC circuit 15B performs the error correction using an LDPC (Low-Density Parity Check) code for example.

The NAND interface circuit 14 is connected to the NAND flash memory 2 via a NAND bus, and performs the interface process with respect to the NAND flash memory 2. In addition, the NAND interface circuit 14 transfers and receives commands, addresses, and data with respect to the NAND flash memory 2.

[1-1] Configuration of NAND Flash Memory 2

Figure 2:
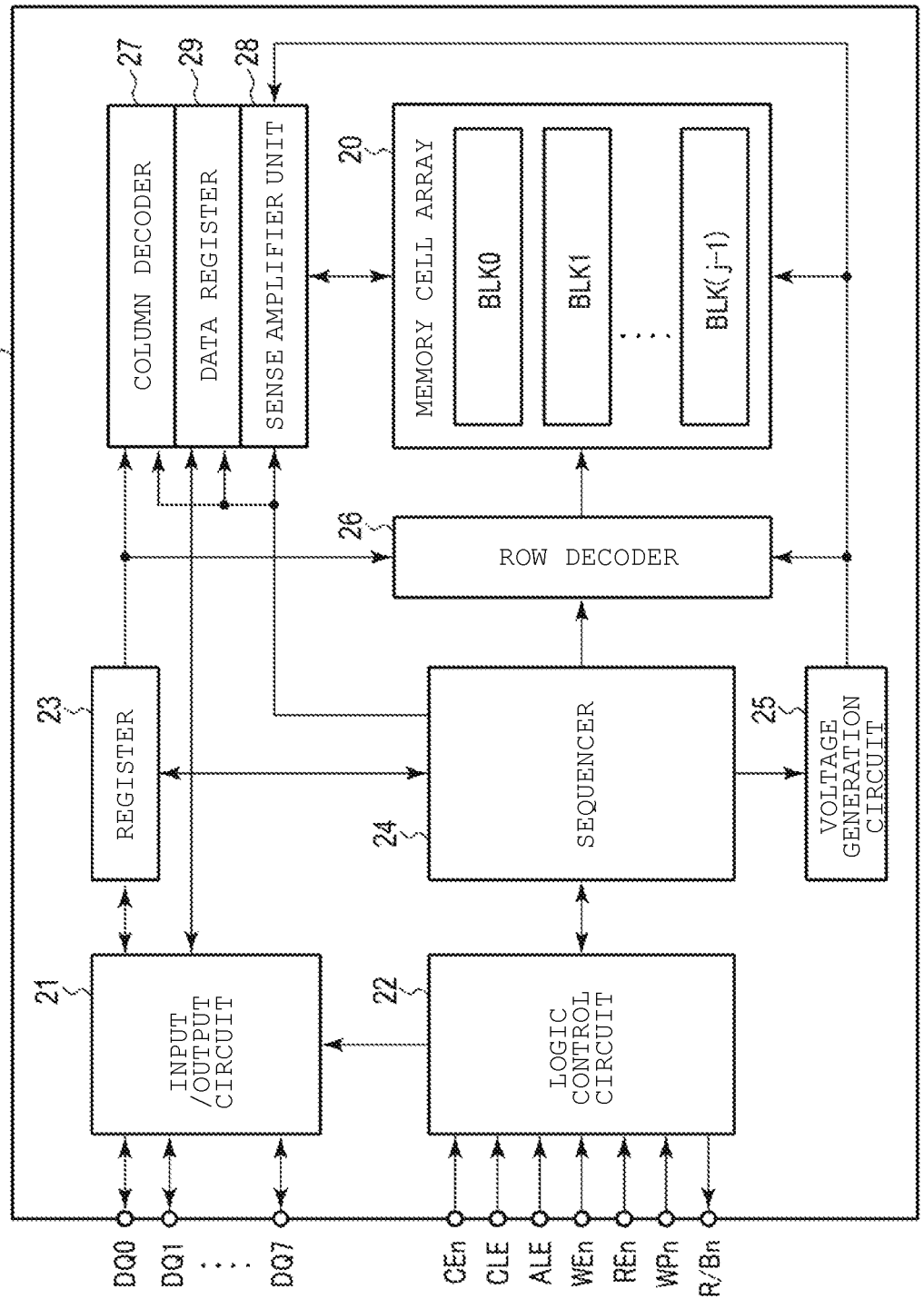
FIG. 2 is a block diagram of a NAND flash memory illustrated in FIG. 1.

FIG. 2 is a block diagram of the NAND flash memory 2 illustrated in FIG. 1.

The NAND flash memory 2 includes a memory cell array 20, an input/output circuit 21, a logic control circuit 22, a register 23, a sequencer (which is a control circuit) 24, a voltage generation circuit 25, a row decoder 26, a column decoder 27, a sense amplifier unit 28, and a data register (also referred to as a data cache) 29.

The memory cell array 20 includes j blocks BLK0 to BLK(j−1). "j" is an integer of 1 or more. Each of the plurality of blocks BLK includes a plurality of memory cell transistors. The memory cell transistor is an electrically-rewritable memory cell. The memory cell array 20 includes a plurality of bit lines, a plurality of word lines, and a source line through which voltages are to be applied to the memory cell transistor. A specific configuration of the block BLK will be described below.

The input/output circuit 21 and the logic control circuit 22 are connected to the memory controller 3 via the NAND bus. The input/output circuit 21 transfers and receives a signal DQ (for example, DQ0 to DQ7) with respect to the memory controller 3 via the NAND bus.

The logic control circuit 22 receives an external control signal (for example, a chip enable signal CEn, a command latch enable signal CLE, an address latch enable signal ALE, a write enable signal WEn, a read enable signal REn, and a write protect signal WPn) from the memory controller 3 via the NAND bus. "n" attached to each signal name indicates that an active signal is a low signal. In addition, the logic control circuit 22 transfers a ready/busy signal RBn to the memory controller 3 via the NAND bus.

The signal CEn enables a selection of the NAND flash memory 2. The signal CLE enables a command transferred as the signal DQ to be latched to a command register. The signal ALE enables an address transferred as the signal DQ to be latched to an address register. The signal WEn enables a write operation. The signal REn enables a read operation. The signal WPn disables the write and erasing operations. The signal RBn indicates whether the NAND flash memory 2 is in a ready state (a state where a command can be received from the outside) or in a busy state (a state where a command cannot be received from the outside). The memory controller 3 can confirm the state of the NAND flash memory 2 by receiving the signal RBn. A case where the signal RBn is a high level indicates the ready state, and a case where the signal RBn is a low level indicates the busy state.

The register 23 includes the command register, the address register, and a status register. The command register temporally stores a command. The address register temporally stores an address. The status register temporally stores status data. The register 23 is an SRAM for example.

The control circuit 24 receives a command from the register 23, and collectively controls the NAND flash memory 2 according to a sequence based on the command.

The voltage generation circuit 25 receives a power source voltage from outside of the NAND flash memory 2, and generates a plurality of voltages necessary for the write operation, the read operation, and the erasing operation using the power source voltage. The voltage generation circuit 25 supplies the generated voltages to the memory cell array 20, the row decoder 26, and the sense amplifier unit 28.

The row decoder 26 receives a row address from the register 23, and decodes the row address. The row decoder 26 performs a selection operation of the word line on the basis of the decoded row address. Then, the row decoder 26 transfers the plurality of voltages necessary for the write operation, the read operation, and the erasing operation to the selected block.

The column decoder 27 receives a column address from the register 23, and decodes the column address. The column decoder 27 selects a bit line on the basis of the decoded column address.

When reading data, the sense amplifier unit 28 detects data read out of the memory cell transistor through the bit line and amplifies the signal. In addition, when writing data, the sense amplifier unit 28 transfers write data to the bit line.

When reading data, the data register 29 temporally stores the data transferred from the sense amplifier unit 28, and transfers the data to the input/output circuit 21 in series. In addition, when writing data, the data register 29 temporally stores the data transferred in series from the input/output circuit 21, and transfers the data to the sense amplifier unit 28. The data register 29 is an SRAM for example.

[1-2] Configuration of Block BLK

Figure 3:
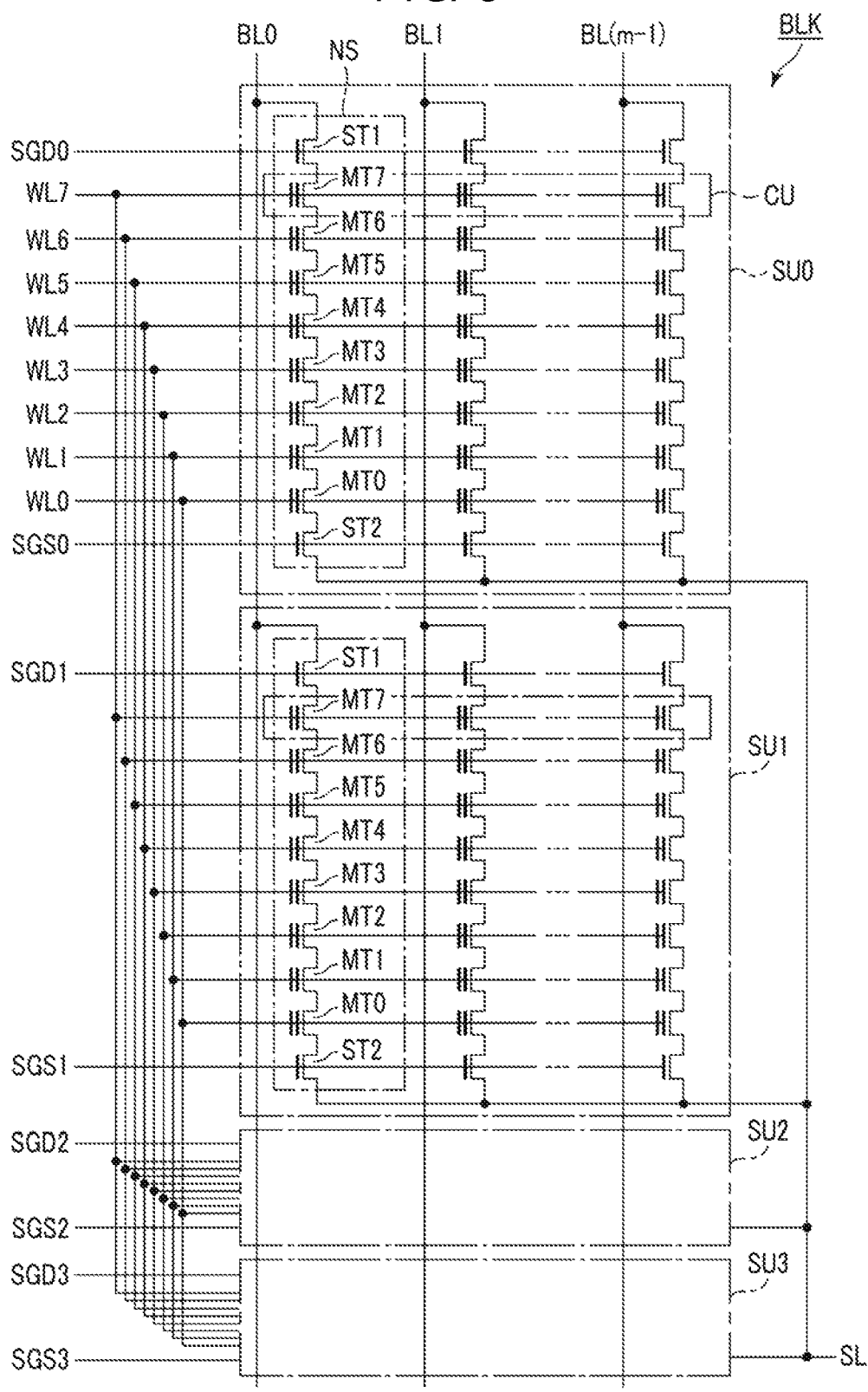
FIG. 3 is a circuit diagram of a block which is provided in a memory cell array.

FIG. 3 is a circuit diagram of the block BLK which is provided in the memory cell array 20. Each of the plurality of blocks BLK includes a plurality of string units SU. In FIG. 3, four string units SU0 to SU3 are illustrated. The number of string units SU provided in one block BLK may be any number.

Each of the plurality of string units SU includes a plurality of NAND strings (more generally referred to as a memory string) NS. The number of NAND strings NS provided in one string unit SU may be any number.

Each of the plurality of NAND strings NS includes a plurality of memory cell transistors MT and two select transistors ST1 and ST2. The plurality of memory cell transistors MT are connected in series between the source of the select transistor ST1 and the drain of the select transistor ST2. In this specification, the memory cell transistor may be referred to as a memory cell or a cell. FIG. 3 illustrates an example configuration in which the NAND string NS includes eight memory cell transistors MT (MT0 to MT7). The number of memory cell transistors MT provided in the NAND string NS may be any number. The memory cell transistor MT includes a control gate electrode and a charge storage layer, and stores data in a nonvolatile manner. The memory cell transistor MT can store 1-bit data, or 2-bit data, or data of more bits.

Gates of a plurality of select transistors ST1 provided in the string unit SU0 are commonly connected to a select gate line SGD0. Similarly, select gate lines SGD1 to SGD3 are connected to the string units SU1 to SU3 respectively. Gates of a plurality of select transistors ST2 provided in the string unit SU0 are commonly connected to the select gate line SGS0. Similarly, the select gate lines SGS1 to SGS3 are connected to the string units SU1 to SU3, respectively. The gates of the plurality of select transistors ST2 in each block BLK may be connected to a common select gate line SGS. The control gates of the memory cell transistors MT0 to MT7 in each block BLK are connected to word lines WL0 to WL7 respectively.

Among the NAND strings NS arranged in a matrix configuration in each block BLK, the drains of the select transistors ST1 of the plurality of NAND strings NS in the same column are commonly connected to one of bit lines BL0 to BL (m−1). "m" is an integer of 1 or more. Further, each bit line BL is connected to one NAND string NS in each string unit SU across the plurality of blocks BLK. The sources of the plurality of select transistors ST2 provided in each block BLK are commonly connected to a source line SL. The source line SL is commonly connected to the plurality of NAND strings NS across the plurality of blocks for example.

Data of the plurality of memory cell transistors MT in each block BLK is collectively erased for example. Data is collectively read and written with respect to the plurality of memory cell transistors MT commonly connected to one word line WL which is disposed in one string unit SU. Such a set of memory cell transistors MT having the common word line WL in one string unit SU is referred to as a cell unit CU. A group of 1-bit data stored in the plurality of memory cell transistors MT provided in the cell unit CU is referred to as a page. In other words, the write operation and the read operation with respect to the cell unit CU are performed in units of pages.

Further, the NAND string NS may include a dummy cell transistor. Specifically, for example, two dummy cell transistors DT0 and DT1 are connected in series between the select transistor ST2 and the memory cell transistor MT0. For example, two dummy cell transistors DT2 and DT3 are connected in series between the memory cell transistor MT7 and the select transistor ST1. The gates of the dummy cell transistors DT0 to DT3 are connected to dummy word lines WLD0 to WLD3. The structure of the dummy cell transistor is the same as that of the memory cell transistor. The dummy cell transistor is not used to store data, but serves to buffer a disturb to the memory cell transistor and the select transistor during the write operation and the erasing operation.

[1-3] Stacked Structure of Block BLK

Figure 4:
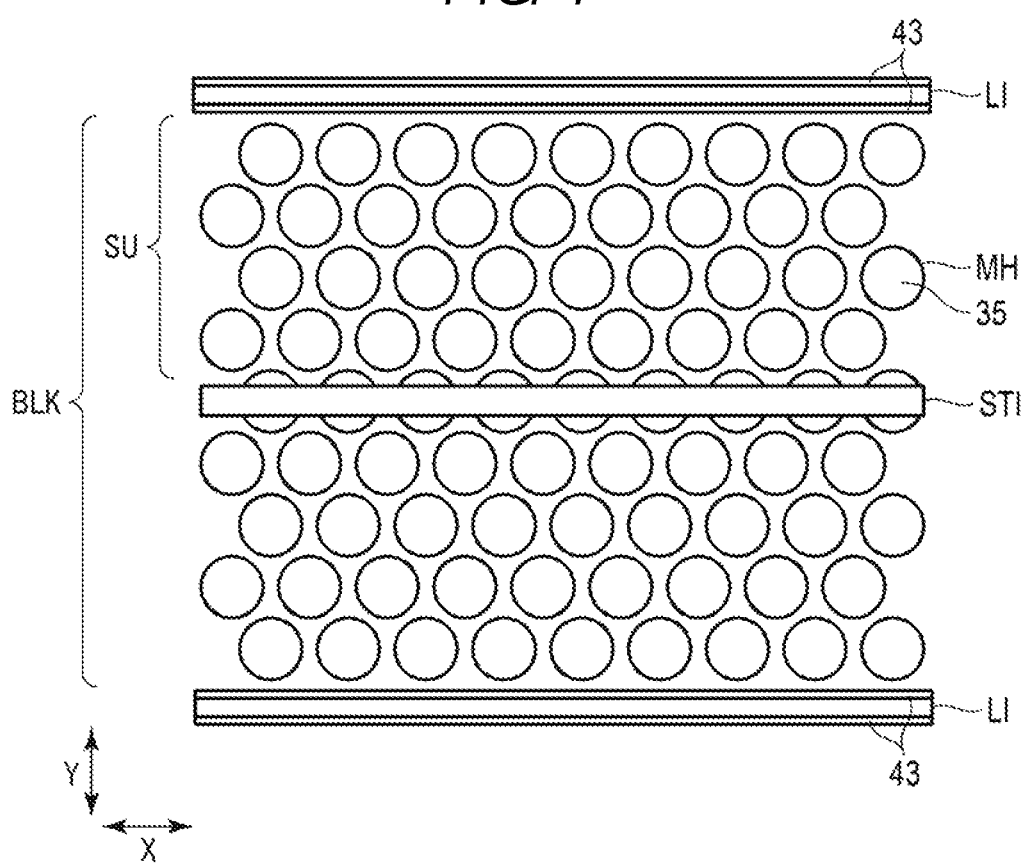
FIG. 4 is a top view of the block which is provided in the memory cell array.
Figure 5:
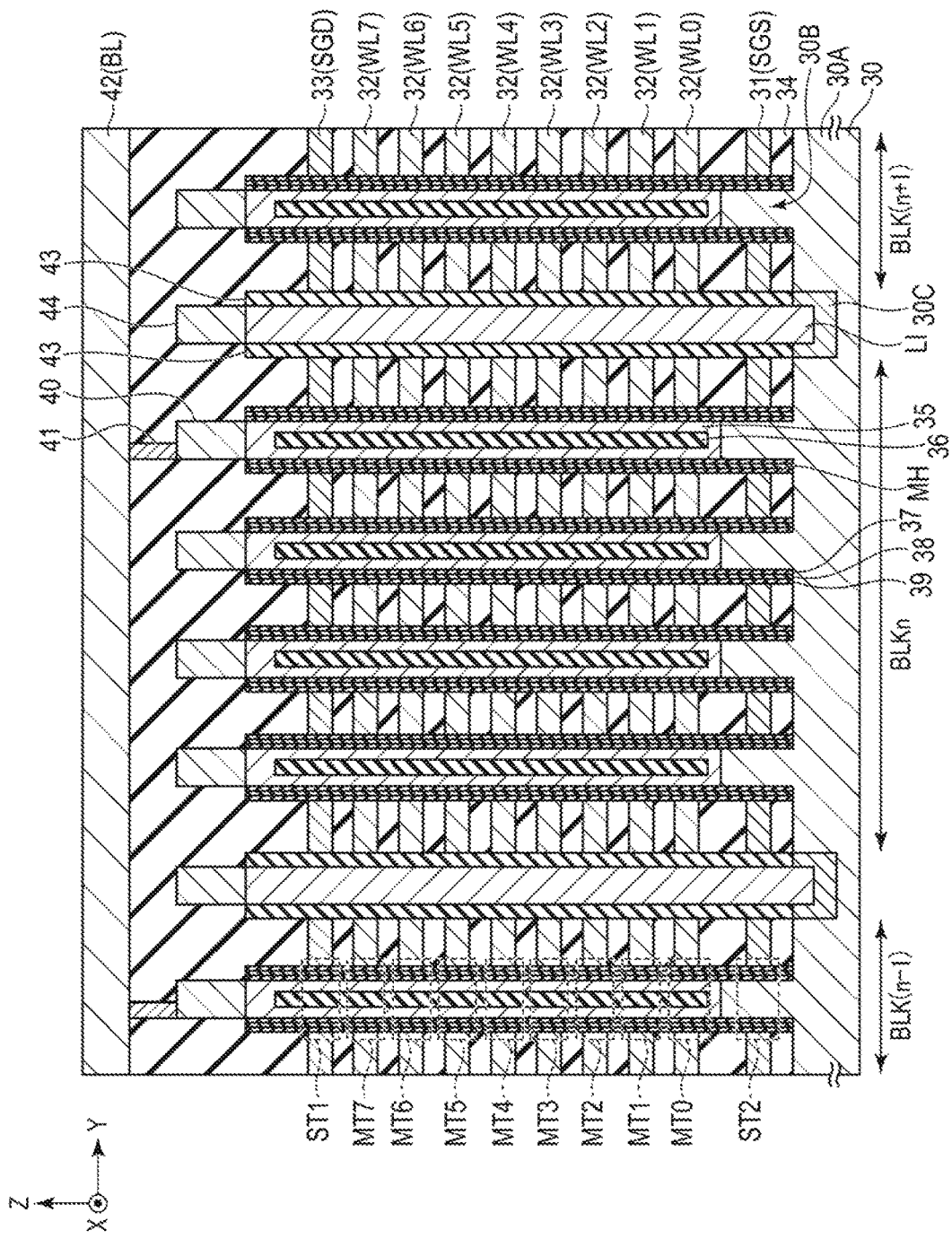
FIG. 5 is a cross-sectional view of the block which is provided in the memory cell array.

FIG. 4 is a top view of the block BLK which is provided in the memory cell array 20. FIG. 5 is a cross-sectional view of the block BLK which is provided in the memory cell array 20. The X direction is a direction along which the select gate line extends. The Y direction is a direction perpendicular to the X direction in a horizontal plane, along which the bit line extends. The Z direction is a stacking direction.

As illustrated in FIG. 4, the block BLK includes a plurality of memory holes MH which is arranged in a staggered manner, for example. Two adjacent blocks BLKs are electrically separated via a line unit LI. The line unit LI electrically connects the source line and a semiconductor substrate. A dividing unit STI is formed of an insulating material, and electrically separates a select gate line SGD of adjacent string units SUs.

FIG. 5 illustrates three block BLK(n−1) to BLK(n+1) with the block BLKn at the center. Further, while the dividing unit STI is not illustrated in FIG. 5, as described above, the dividing unit STI is an insulating member which separates the select gate line SGD.

A semiconductor substrate 30 is a silicon board for example. The semiconductor substrate 30 includes a p-type well region 30A in an upper surface region thereof. The plurality of NAND strings NS is provided on the p-type well region 30A. In other words, a wiring layer 31 serving as the select gate line SGS, eight wiring layers 32 serving as word lines WL0 to WL7, and a wiring layer 33 serving as the select gate line SGD are sequentially stacked on the well region 30A. A plurality of insulating layers 34 is provided between the plurality of the stacked wiring layers.

The memory hole MH passes through the wiring layers 31, 32, and 33 to reach the well region 30A. An epitaxial layer 30B made of the same material as that of the semiconductor substrate 30 is provided in and below the memory hole MH. A pillar-shaped semiconductor layer (also referred to herein as a semiconductor pillar) 35 is provided in the memory hole MH and above the epitaxial layer 30B. A core 36 is provided in the semiconductor pillar 35. The core 36 is formed of an insulating material (for example, silicon oxide).

A gate insulating film 37, a charge storage layer 38, and a block insulating film 39 are sequentially provided in the side surface of the semiconductor pillar 35. With these components, the memory cell transistor MT, and the select transistors ST1 and ST2 are formed. The semiconductor pillar 35 serves as a current path of the NAND string NS, and becomes a region where a channel of each transistor is formed. A contact plug 40 is provided on the semiconductor pillar 35. The contact plug 40 is connected to a metal wiring layer 42, which extends in the Y direction, via a via plug 41. The metal wiring layer 42 serves as the bit line BL.

A $p^+$-type diffusion layer 30C to which highly concentrated p-type impurities are injected is provided in the well region 30A. The line unit LI extending in the X direction and the Z direction is provided on the diffusion layer 30C. An insulating layer 43 is provided on both side surfaces of the line unit LI. The insulating layer 43 has a function of electrically separating the line unit LI from the word line and the select gate line. A contact plug 44 is provided on the line unit LI. The contact plug 44 is connected to the source line SL (not illustrated).

[1-4] Distribution of Threshold of Memory Cell Transistor

Figure 6:
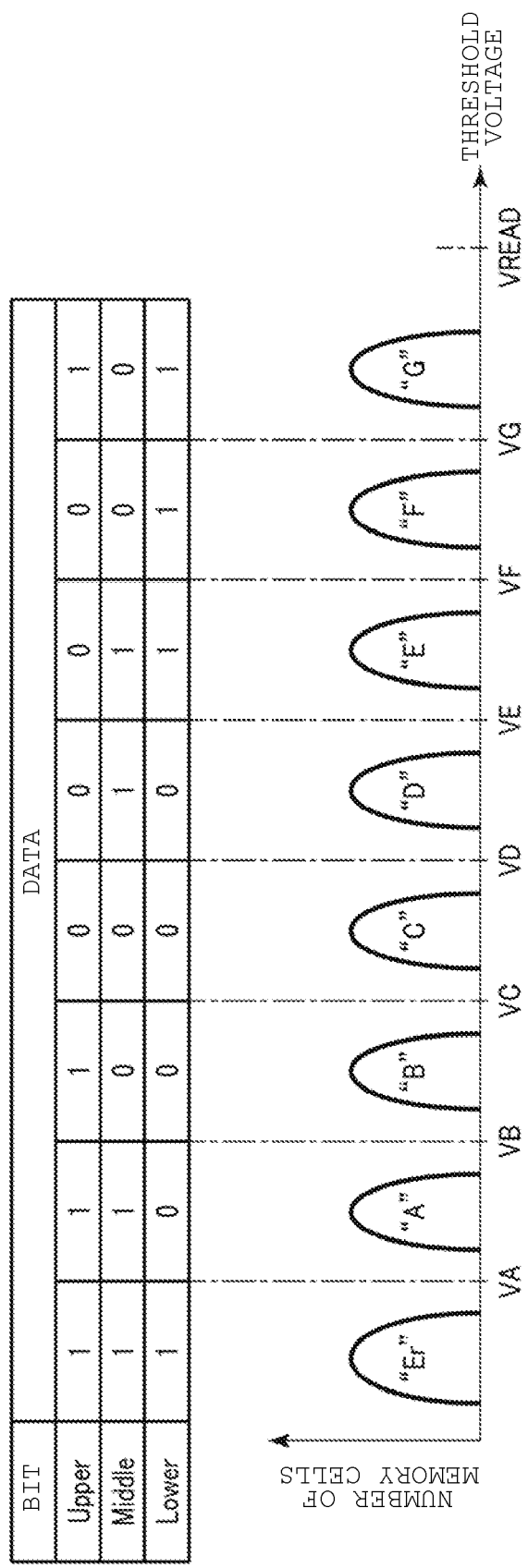
FIG. 6 is a schematic diagram illustrating an example distribution of threshold voltages of a memory cell transistor.

Next, the description will be given about a distribution of threshold voltages Vth of the memory cell transistor MT. FIG. 6 is a schematic diagram illustrating an exemplary distribution of the threshold voltages of the memory cell transistor MT. The memory cell transistor MT can store n-bit data. In this embodiment, the description will be given about a case where the memory cell transistor MT stores 3-bit data, that is, a TLC (triple level cell) system.

The 3-bit data is defined by a lower bit, a middle bit, and an upper bit. In a case where the memory cell transistor MT stores 3 bits, the memory cell transistor MT has any one of eight threshold voltage levels. The eight threshold voltage levels are referred to as States "Er", "A", "B", "C", "D", "E", "F", and "G" in an ascending order. The plurality of memory cell transistors MT belonging to States "Er", "A", "B", "C", "D", "E", "F", and "G" form a distribution.

For example, data "111", "110", "100", "000", "010", "011", "001", and "101" are assigned to States "Er", "A", "B", "C", "D", "E", "F", and "G" respectively. The order of bits is the upper bit, the middle bit, and the lower bit from the left. The distribution of the threshold voltages and the data may be assigned in any manner.

A state to which the threshold voltage of the memory cell transistor MT belongs is determined in order to read data stored in a read-target memory cell transistor MT. For the determination of a state, the read voltages VA, VB, VC, VD, VE, VF, and VG are used.

State "Er" corresponds to a state (referred to as erase state) in which data is erased for example. The threshold voltage of the memory cell transistor MT belonging to State "Er" is lower than the voltage VA, and has a negative value for example.

States "A" to "G" correspond to a state in which charges are injected to the charge storage layer to write data to the memory cell transistor MT. The threshold voltage of the memory cell transistor MT belonging to States "A" to "G" has a positive value for example. The threshold voltage of the memory cell transistor MT belonging to State "A" is higher than the read voltage VA and equal to or less than the read voltage VB. The threshold voltage of the memory cell transistor MT belonging to State "B" is higher than the read voltage VB and equal to or less than the read voltage VC. The threshold voltage of the memory cell transistor MT belonging to State "C" is higher than the read voltage VC and equal to or less than the read voltage VD. The threshold voltage of the memory cell transistor MT belonging to State "D" is higher than the read voltage VD and equal to or less than the read voltage VE. The threshold voltage of the memory cell transistor MT belonging to State "E" is higher than the read voltage VE and equal to or less than the read voltage VF. The threshold voltage of the memory cell transistor MT belonging to State "F" is higher than the read voltage VF and equal to or less than the read voltage VG. The threshold voltage of the memory cell transistor MT belonging to State "G" is higher than the read voltage VG and equal to or less than a non-select read voltage VREAD. The non-select read voltage VREAD is a voltage to be applied to the word line WL connected to the memory cell transistor MT of the cell unit CU which is a non-read target, and is higher than the threshold voltage of the memory cell transistor MT in any other state. In other words, the memory cell transistor MT of which the control gate electrode is applied with the non-select read voltage VREAD enters an ON state regardless of the stored data.

As described above, the memory cell transistor MT has any one of eight threshold voltage levels, corresponding to eight different states. In addition, writing and reading data are performed on one cell unit CU in units of pages. In a case where the memory cell transistor MT stores 3-bit data, three pages in one cell unit CU are each assigned the lower bit, the middle bit, and the upper bit. In the following description, the pages to be collectively written or read with respect to the lower bit, the middle bit, and the upper bit each are referred to as a lower page, a middle page, and an upper page.

[1-5] Configurations of Sense Amplifier Unit 28 and Data Register 29

Figure 7:
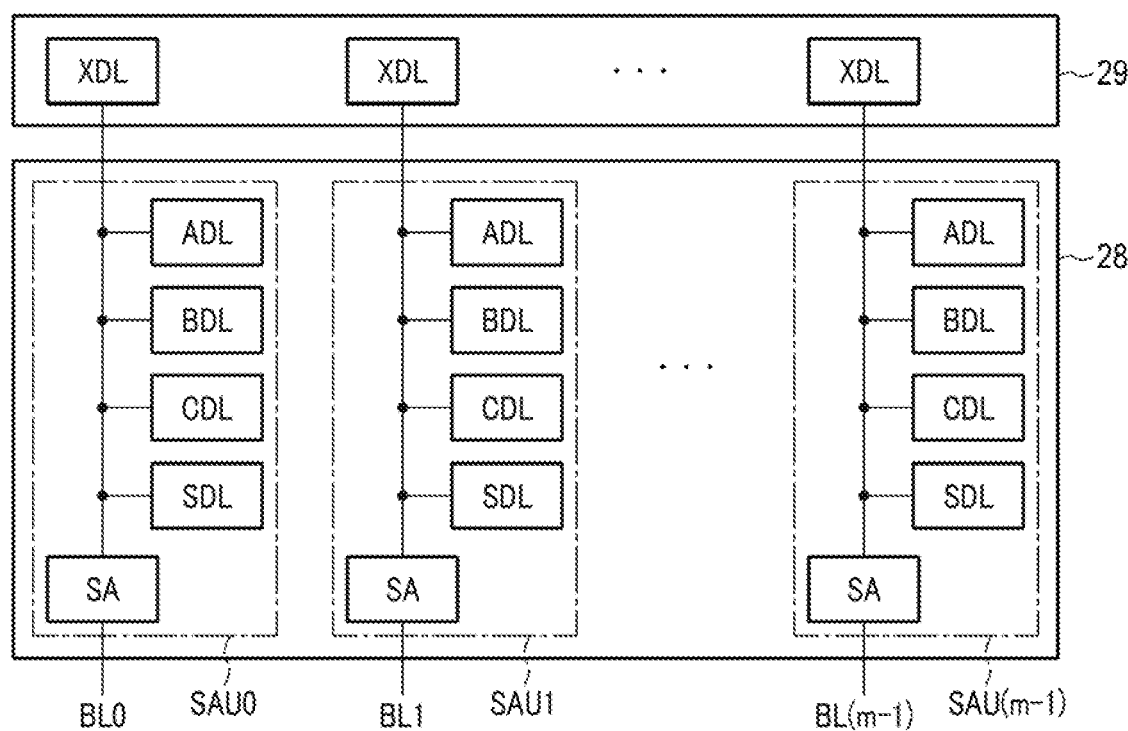
FIG. 7 is a block diagram of a sense amplifier unit and a data register illustrated in FIG. 2.

FIG. 7 is a block diagram of the sense amplifier unit 28 and the data register 29 illustrated in FIG. 2.

The sense amplifier unit 28 includes sense amplifier units SAU0 to SAU(m−1) corresponding to the bit lines BL0 to BL (m−1). Each sense amplifier unit SAU includes a sense amplifier SA and data latch circuits SDL, ADL, BDL, and CDL. The sense amplifier SA and the data latch circuits SDL, ADL, BDL, and CDL are interconnected to transfer data to each other.

The data latch circuits SDL, ADL, BDL, and CDL temporally store data. At the time of the write operation, the sense amplifier SA controls a voltage of the bit line BL in accordance with the data stored in the data latch circuit SDL. The data latch circuits ADL, BDL, and CDL are used in a multi-level operation to cause the memory cell transistor MT to store 2-bit data or more. In other words, the data latch circuit ADL is used to store the lower page. The data latch circuit BDL is used to store the middle page. The data latch circuit CDL is used to store the upper page. The number of data latch circuits provided in the sense amplifier unit SAU can be changed in any manner according to the number of bits stored in one memory cell transistor MT.

At the time of the read operation, the sense amplifier SA detects data which is read out of the corresponding bit line BL, and determines whether the data is data "0" or data "1". In addition, at the time of the write operation, the sense amplifier SA applies a voltage to the bit line BL on the basis of the write data.

The data register 29 includes data latch circuits XDL in as many number as the sense amplifier unit SAU0 to SAU(m−1). The data latch circuit XDL is connected to the input/output circuit 21. The data latch circuit XDL temporally stores the write data which is sent from the input/output circuit 21. In addition, the data latch circuit XDL temporally stores the read data which is sent from the sense amplifier unit SAU. More specifically, data transmission between the input/output circuit 21 and the sense amplifier unit 28 is performed via the data latch circuits XDL up to one page at a time. The write data which is received by the input/output circuit 21 is transferred to any one of the data latch circuits ADL, BDL, and CDL via the data latch circuit XDL. The read data which is read out by the sense amplifier SA is transferred to the input/output circuit 21 via the data latch circuit XDL.

[2] Defective State of Memory Cell Array 20

Next, a defective state of the memory cell array 20 will be described.

The memory hole MH extends in the Z direction, and becomes long as the stacking number of the word lines is increased. In other words, the memory hole MH is difficult to process as the stacking number of the word lines is increased. When the memory hole MH does not reach the semiconductor substrate 30, the semiconductor pillar 35 formed in the memory hole MH is not electrically connected to the source line SL. In other words, the circuit connection to the source line from the memory hole MH becomes open and this failure is hereinafter referred to as an open failure.

Figure 8:
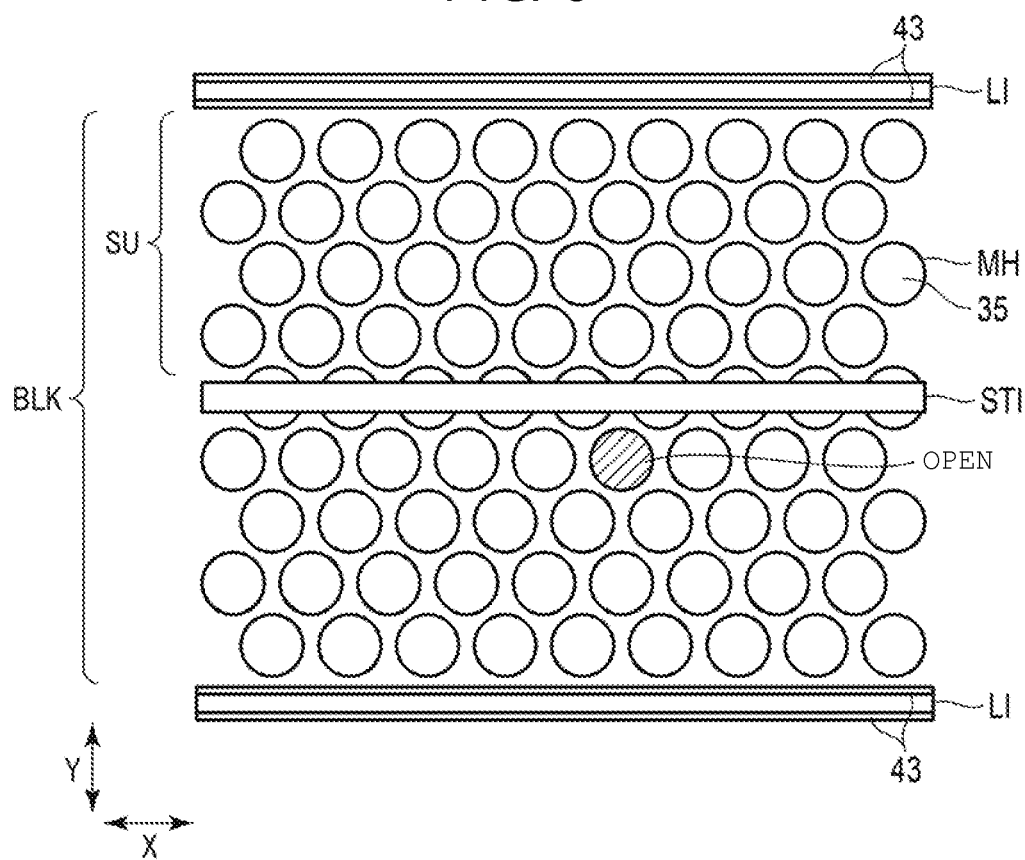
FIGS. 8-10 are different diagrams for describing an open failure.
Figure 9:
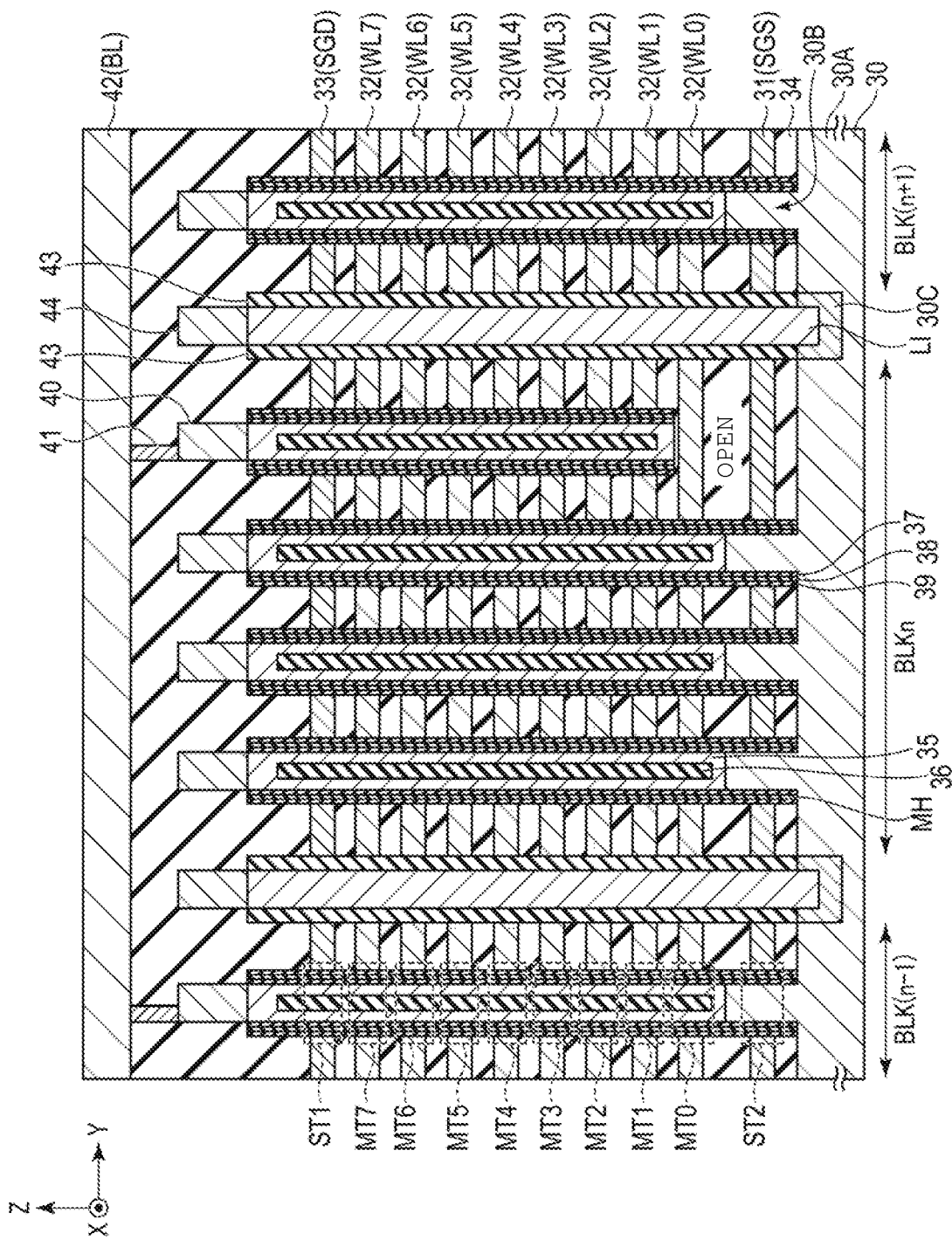
Figure 10:
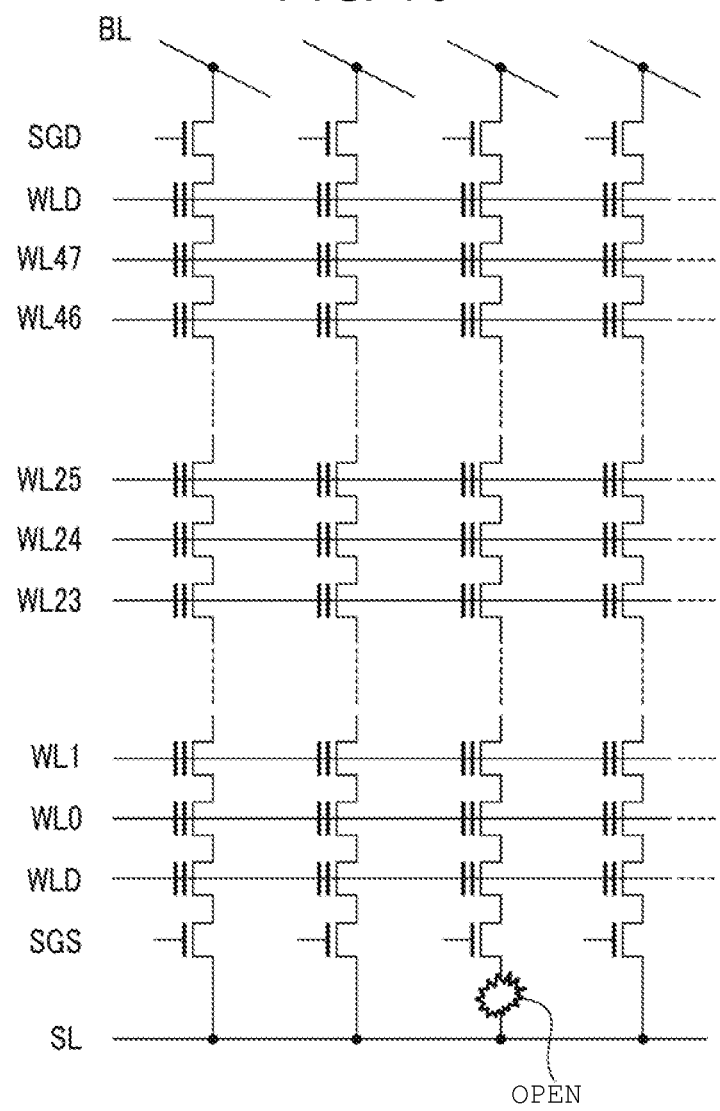

FIGS. 8 to 10 are diagrams for describing the open failure. FIG. 8 is a top view, and FIG. 9 is a cross-sectional view, and FIG. 10 is a circuit diagram. FIG. 10 illustrates an example in which the string unit SU includes the word lines WL0 to WL47 and two dummy word lines WLD.

As illustrated in FIG. 9, a memory hole MH does not reach the semiconductor substrate 30, and thus the corresponding memory hole MH causes the open failure. The NAND string NS in the defective memory hole (defective NAND string NS) enters an OFF state regardless of the threshold voltage of the memory cell transistor MT. Therefore, the data of the defective NAND string NS is not possible to be read.

[3] Operations

Next, the operation of the memory system 1 configured as above will be described.

[3-1] Normal Read

Figure 11:
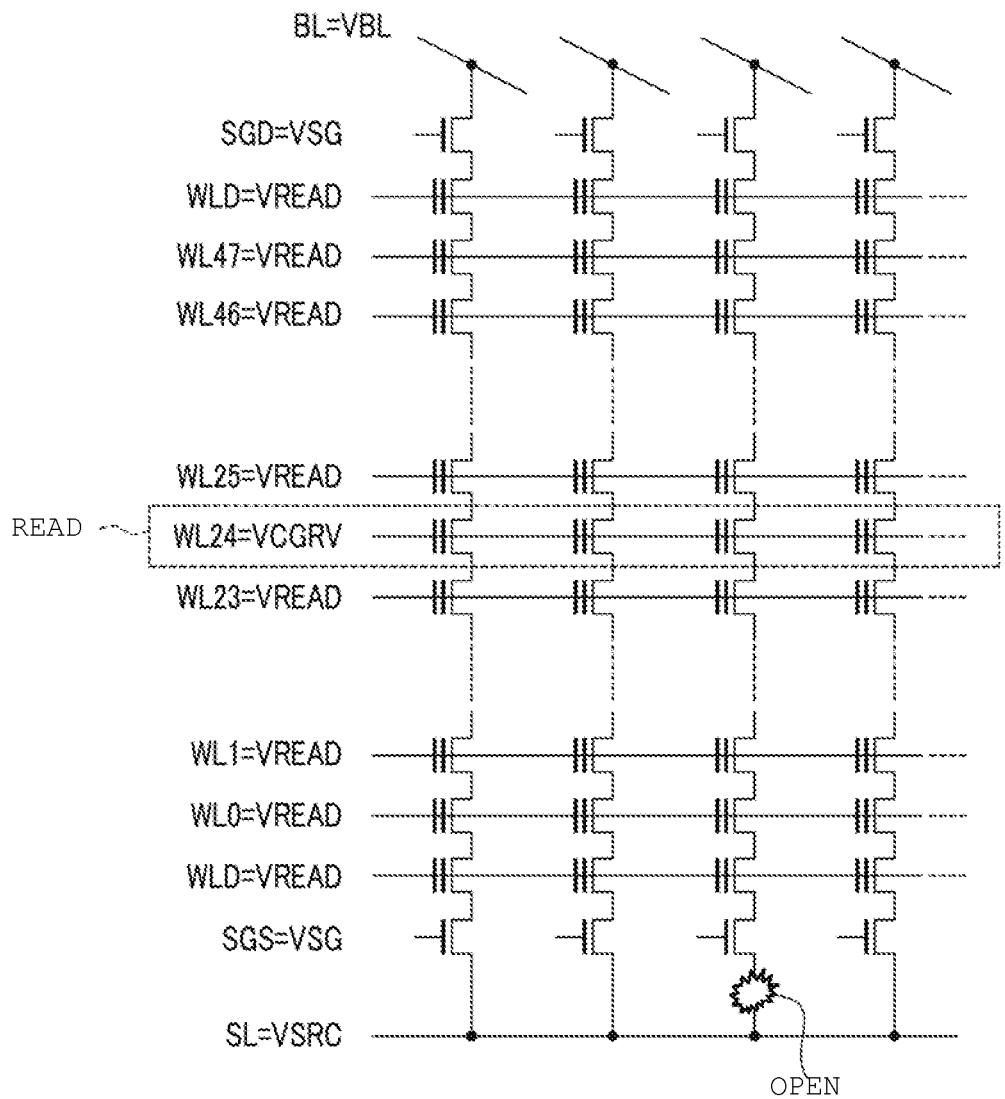
FIG. 11 is a diagram for describing a normal read in the presence of an open failure.

First, a read operation in general will be described. The read operation in general is referred to as a normal read. FIG. 11 is a diagram for describing the normal read in the presence of the open failure. Further, FIG. 11 illustrates the string unit SU of the read target.

The sense amplifier unit 28 charges the bit line BL with a voltage VBL. The voltage VBL is set to satisfy "VDD>VBL>VSS". Herein, "VDD" is a power source voltage, and "VSS" is a ground voltage. The row decoder 26 applies a voltage VSRC to the source line SL. The voltage VSRC is set to satisfy "VBL>VSRC≥VSS".

Subsequently, the row decoder 26 applies a voltage VSG to the select gate lines SGD and SGS. The voltage VSG is a voltage which can cause the select transistors ST1 and ST2 to be turned on.

Subsequently, the row decoder 26 applies a read voltage VCGRV to the selected word line WL, and applies the non-select read voltage VREAD to all the word lines other than the selected word line WL. The read voltage VCGRV is a voltage to determine the threshold voltage of the selected memory cell, and is appropriately set according to the read data. In FIG. 11, it is assumed that the word line WL24 is a read target.

In such a voltage relation, the sense amplifier unit 28 determines whether the voltage of the bit line BL is discharged at every NAND string NS, and the data of the selected memory cell is read out.

Figure 12:
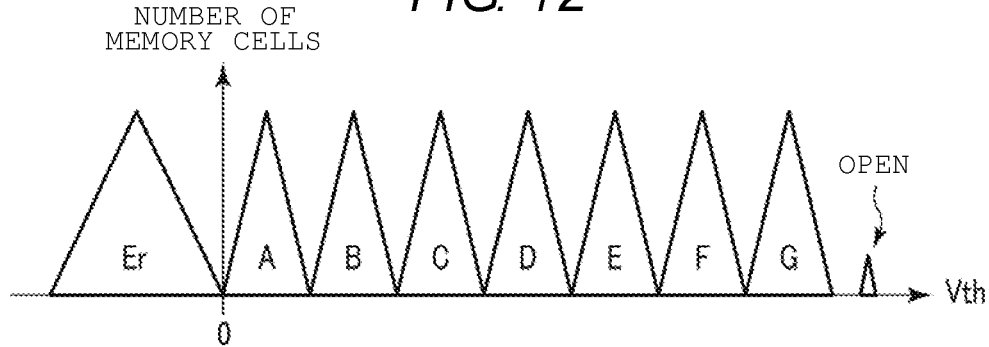
FIG. 12 is a diagram for describing a distribution of the threshold voltages of a defective bit.

As described above, the defective NAND string NS with the open failure enters the OFF state regardless of the threshold voltage of the memory cell. Therefore, in a case where the normal read is performed, a distribution of the threshold voltages of a defective bit may be imaged as FIG. 12.

[3-2] Error Correction

As described above, the ECC unit 15 includes two types of ECC circuits (the first ECC circuit 15A and the second ECC circuit 15B) having different error correction capabilities. The second ECC circuit 15B has an error correction capability higher than that of the first ECC circuit 15A.

The first ECC circuit 15A performs a hard decision decoding. The hard decision decoding performs decoding using the read data. The first ECC circuit 15A performs encoding and decoding using a BCH code (referred to herein as BCH correction) for example.

The second ECC circuit 15B performs a soft decision decoding. The soft decision decoding performs decoding using likelihood (specifically, LLR (log likelihood ratio) value) indicating a probability of data. The second ECC circuit 15B performs encoding and decoding using an LDPC code (referred to herein as LDPC correction) for example. The LDPC correction has a higher error correction capability than the BCH correction.

The LDPC correction applies a probability density function of a normal distribution to the read data to derive the most probability result using the variables (likelihood) such as an average value and a standard deviation. Therefore, in a case where there is read data deviated from the normal distribution, it is not possible to obtain an appropriate likelihood, and thus an erroneous normal distribution is derived and the error correction capability may be lowered.

Figure 13:
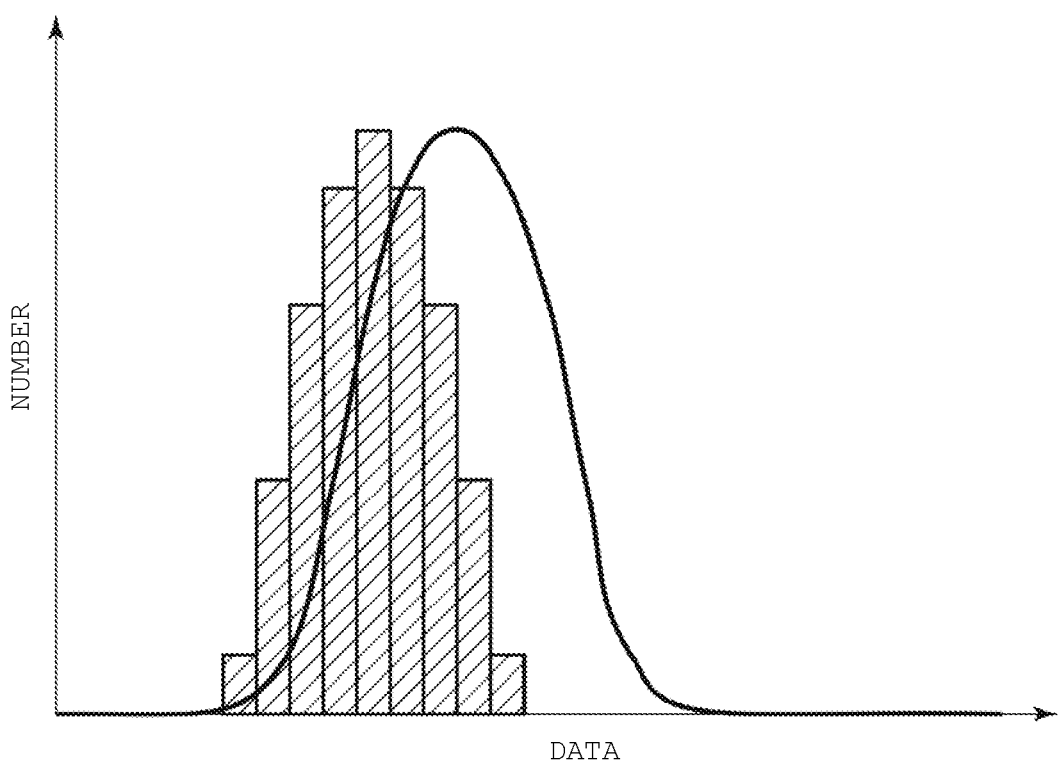
FIGS. 13-15 are schematic diagrams illustrating an LDPC correction.

FIG. 13 illustrates a schematic diagram illustrating the LDPC correction. The horizontal axis of FIG. 13 represents data (e.g., threshold voltage) of the memory cell, and the vertical axis of FIG. 13 represents the number of memory cells.

In a case where the average value and the standard deviation are unknown, a normal distribution is obtained as illustrated in FIG. 13, and the distribution is different from the read data. At that time, the likelihood takes a small value, and a normal distribution having a low probability is expected.

Figure 14:
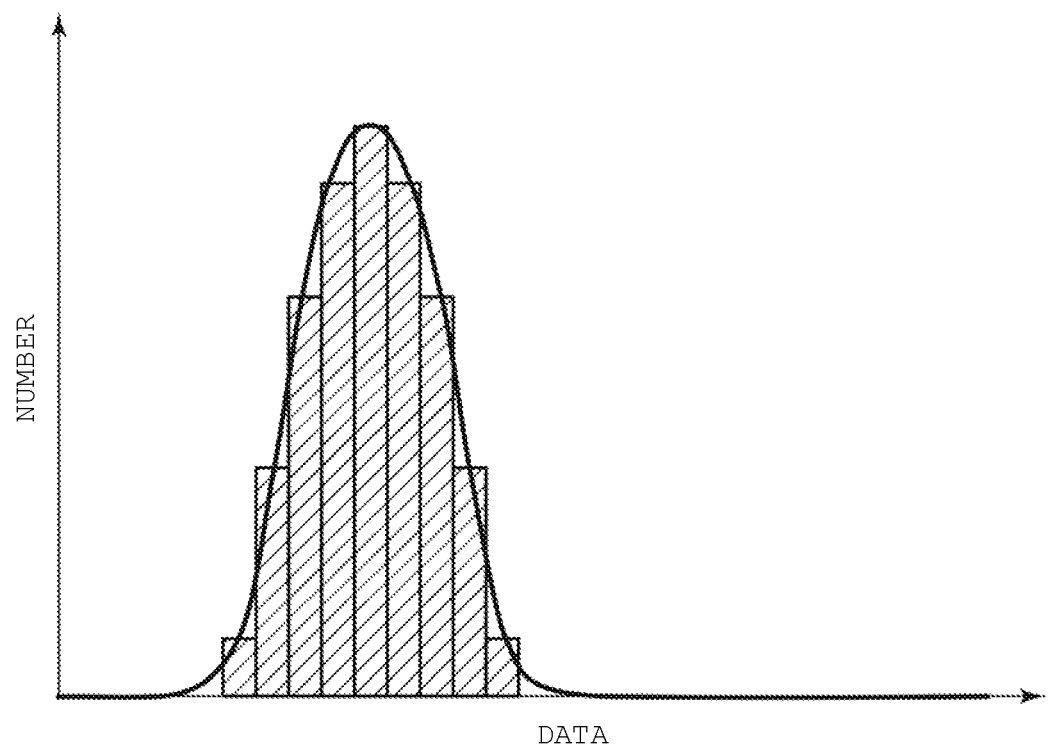

In a case where a maximum likelihood estimation is performed to maximize the likelihood, a normal distribution is obtained to be matched to the real data as illustrated in FIG. 14.

Figure 15:
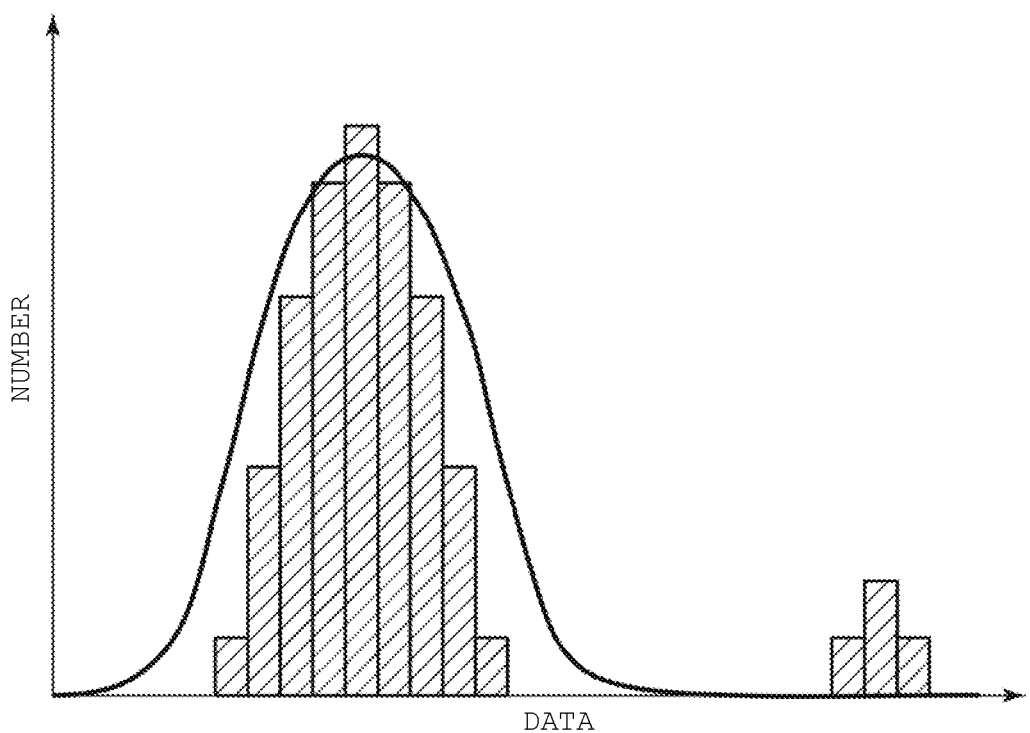

However, in a case where there is data deviated from the normal distribution (such as in the case of a hard error) as illustrated in FIG. 15 in the real data, it is not possible to correctly perform the maximum likelihood estimation, and thus an erroneous normal distribution illustrated in FIG. 15 is expected. Therefore, it may not be possible to accurately perform the error correction.

(Example of BCH Correction)

FIG. 16 is a schematic diagram for describing an example of the BCH correction. FIG. 16 illustrates three columns COL(n−1) to COL(n+1). It is assumed that the column COL(n−1) is in State "B", the column COLn is in State "Er", and the column COL(n+1) is in State "G". State "Er" corresponds to Data "111", State "B" corresponds to Data "100", and State "C" corresponds to Data "101".

The BCH correction is performed on the read data. In addition, the decoding is performed on every an ECC frame (a unit of ECC correction) which is read out of the NAND flash memory 2 in the BCH correction. For example, the ECC frame corresponds to 1 page. Specifically, the first ECC circuit 15A performs the error correction using the error correction code included in the read data. Further, at the time of reading data, the ECC circuit (specifically, an encoder provided in the ECC circuit) generates an error correction code, and the error correction code is written to the memory cell array 20 together with the write data.

Figure 17:
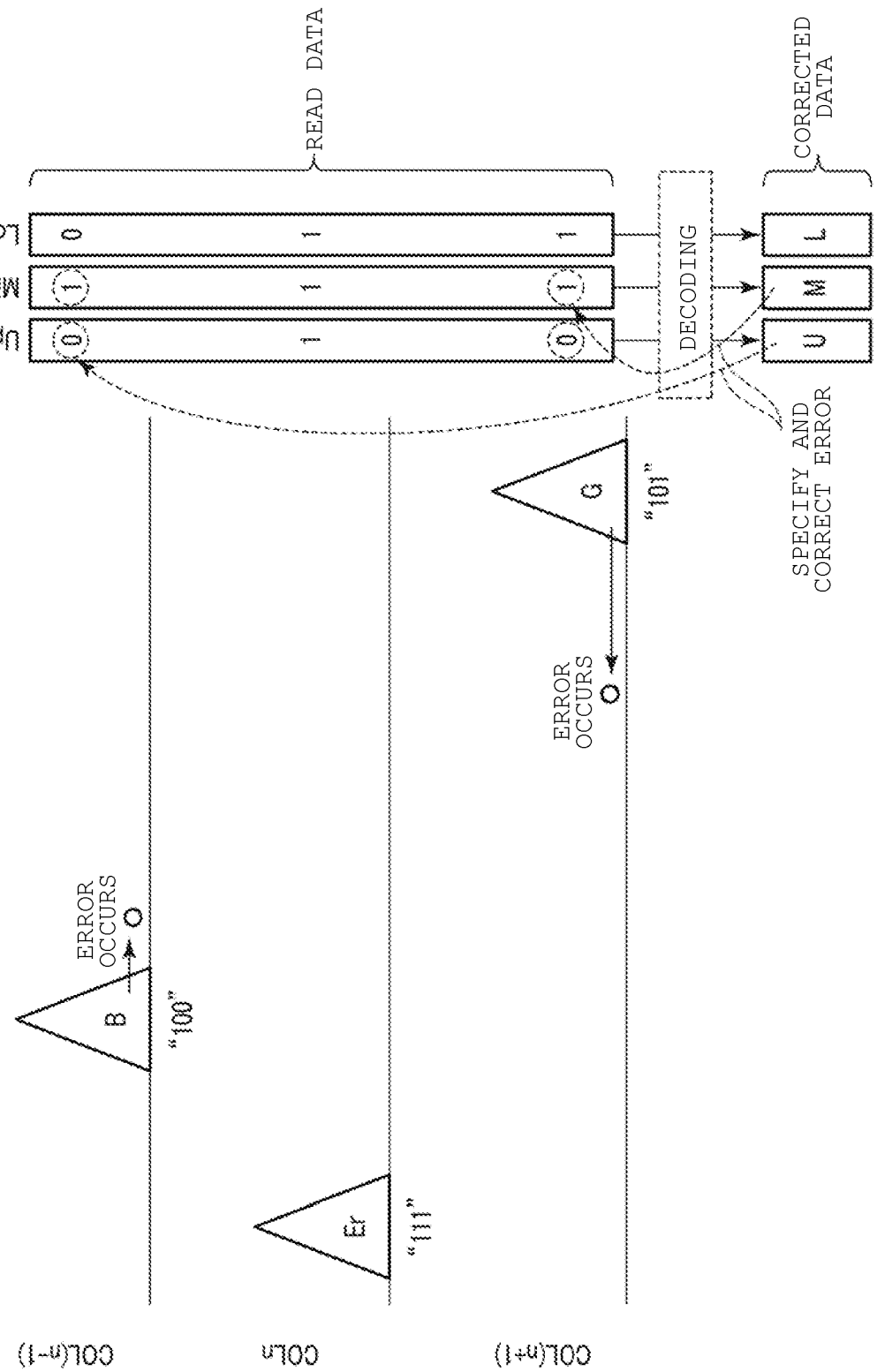
FIG. 17 is a schematic diagram for describing another example of the BCH correction.

FIG. 17 is a schematic diagram for describing another example of the BCH correction. It is assumed that errors occur in the columns COL(n−1) and COL(n+1), Data "010" is read out of the column COL(n−1), and Data "011" is read out of the column COL(n+1).

In the BCH correction, a bit with an error is specified and corrected. In the BCH correction, in a case where an error occurs, a transition between states is not considered. Therefore, error correction efficiency is not changed by the transition of states.

(Example of LDPC Correction)

Figure 18:
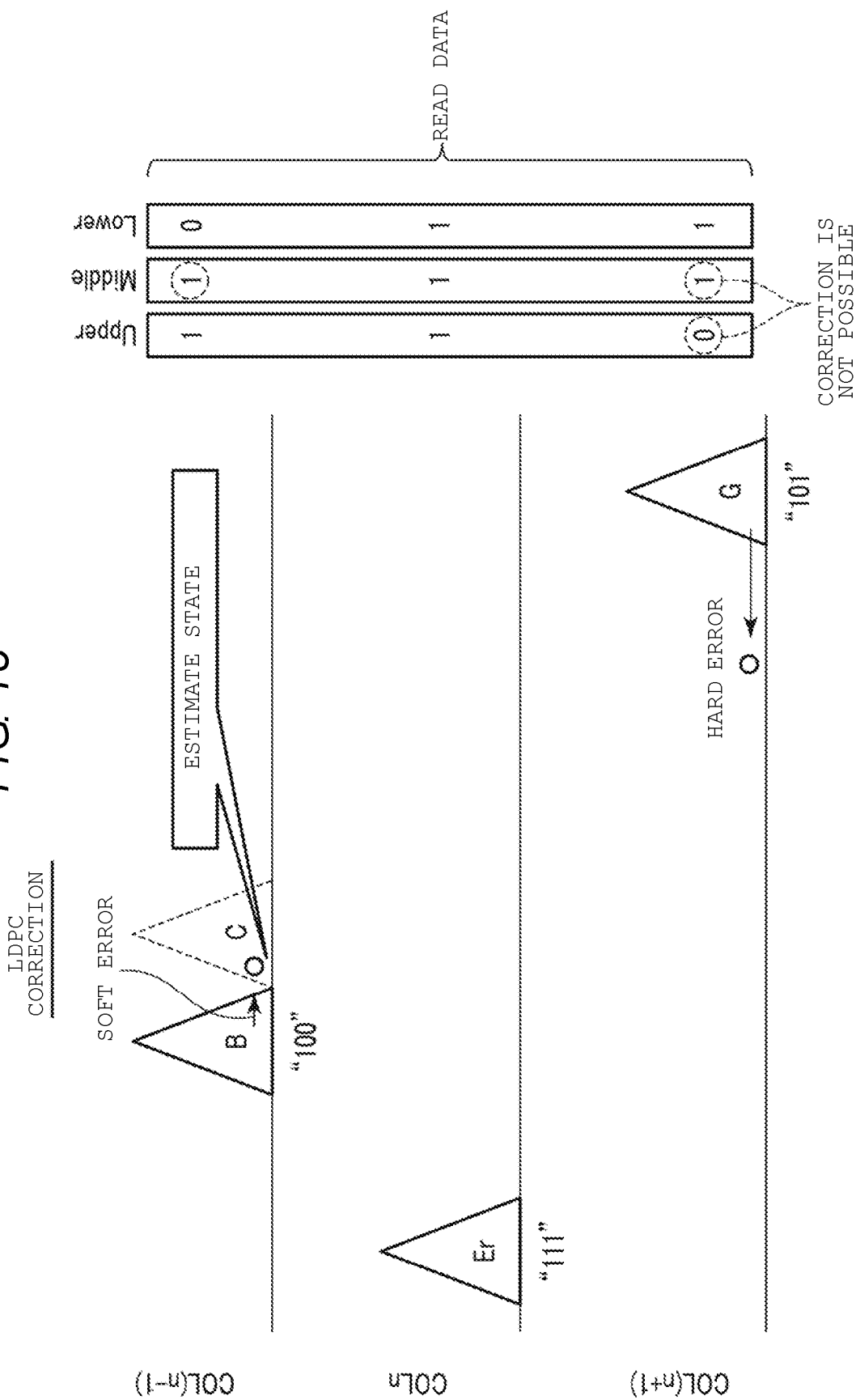
FIG. 18 is a schematic diagram for describing an example of the LDPC correction.

FIG. 18 is a schematic diagram for describing an example of the LDPC correction. It is assumed that the column COL(n−1) is in State "B", the column COLn is in State "Er", and the column COL(n+1) is in State "G". It is assumed that a soft error occurs in the column COL(n−1), and Data "110" is read out. It is assumed that a hard error occurs in the column COL(n+1), and Data "011" is read out.

The soft error is an error in which the memory cell can store data, but the data is rewritten due to some fact such as a voltage or a temperature. The hard error is an error in which a physical defect occurs in the memory cell, and thus data is not written at all (or data is not read out). The open failure is an example of a hard error.

In the LDPC correction, the normal distribution is estimated as described above, and thus there is a need to determine a threshold variation of each state. The soft error can be corrected by estimating the threshold variation. On the other hand, the hard error is deviated from the normal distribution, and thus the error correction is not possible.

In addition, in the LDPC correction, the correction performance is significantly affected by the hard error which is deviated from the normal distribution. In this case, a reduction in correction performance is caused by the LDPC correction. Therefore, in this embodiment, a bit with a hard error is excluded from the calculation of the LDPC correction. With this configuration, the LDPC correction is performed with high accuracy.

[3-3] Read Operation of Memory System 1

Figure 19:
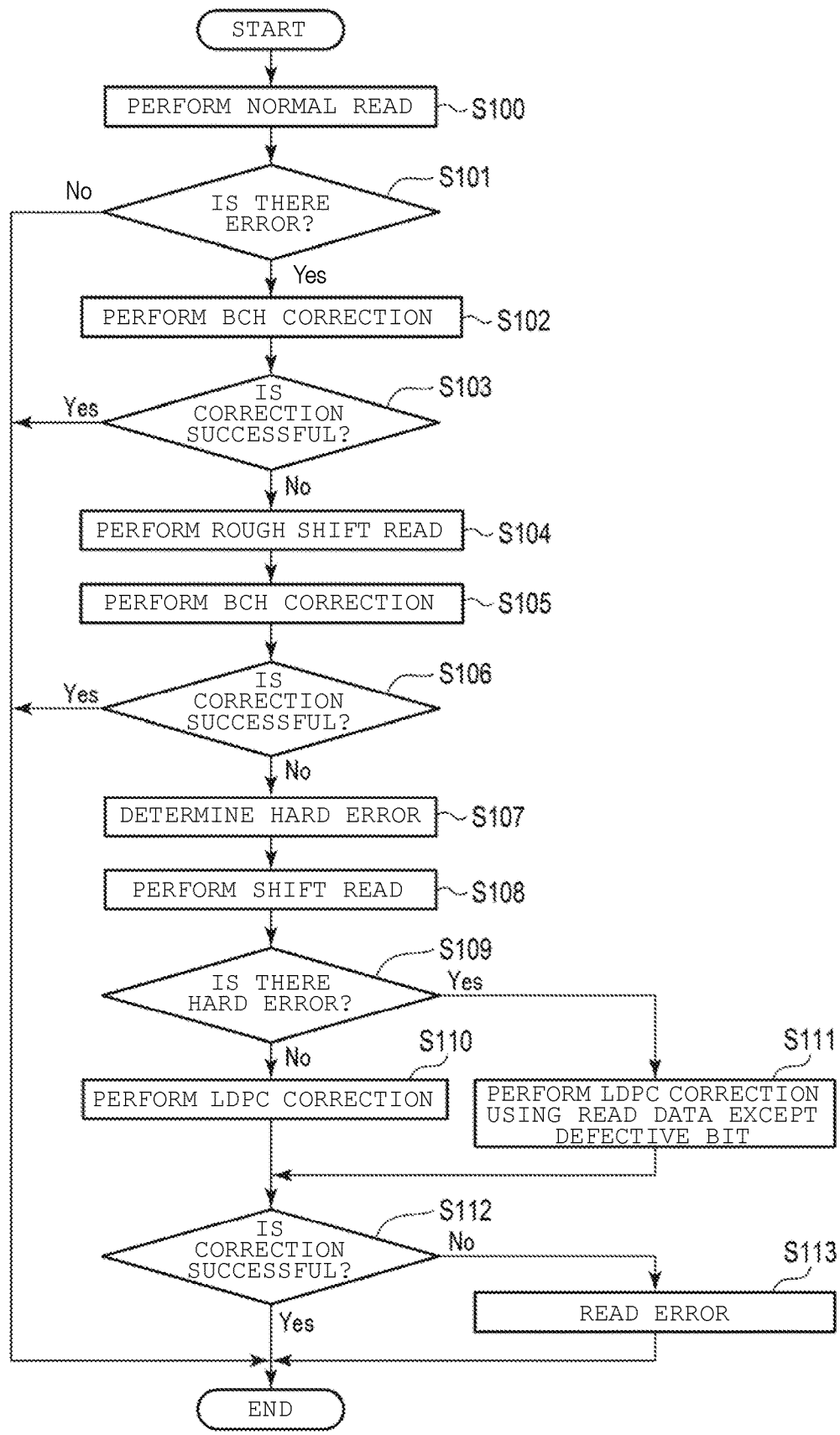
FIG. 19 is a flowchart for describing a read operation executed in the memory system.

FIG. 19 is a flowchart for describing the read operation of the memory system 1.

The memory controller 3 performs the normal read on the NAND flash memory 2 (Step S100). Specifically, in the normal read, the memory controller 3 transfers a read command and an address to the NAND flash memory 2, and then receives the read data from the NAND flash memory 2.

Subsequently, the first ECC circuit 15A determines whether there is an error in the read data using the error correction code included in the read data (Step S101). In a case where there is no error (S101=Yes), the read operation of this time is ended.

In a case where there is an error (S101=No), the first ECC circuit 15A performs a correction process (decoding) using the BCH code (Step S102). In a case where the error correction is successful (S103=Yes), the read operation of this time is ended. Further, in this embodiment, criteria to determine whether the error correction is successful may be any criteria. The error correction may be determined as successful even in a case where all the errors are corrected, or in a case where the number of error bits is equal to or less than a defined value.

In a case where the error correction is not successful (S103=No), the memory controller 3 performs a rough shift read (Step S101). The shift read is a read system in which the read voltage is changed with respect to the normal read. In addition, the rough shift read means that a shift amount of the read voltage is large compared to the shift read described below. The details of the shift read will be described below.

Subsequently, the first ECC circuit 15A performs the correction process using the BCH code with respect to the read data which is read out in the rough shift read of Step S104 (Step S105). In a case where the error correction is successful (S106=Yes), the read operation in this time is ended.

In a case where the error correction is not successful (S106=No), the memory controller 3 determines the hard error (including the open failure) (Step S107). Specifically, the memory controller 3 transfers a command to the NAND flash memory 2 in order to designate an operation of determining the hard error. The NAND flash memory 2 performs a determination operation of the hard error in response. The determination operation of the hard error is the same as the normal read operation except a voltage to be applied to the word line. The details of the operation of determining the hard error will be described below.

Then, the NAND flash memory 2 transfers a determination result (which is the read result) to the memory controller 3. The memory controller 3 determines whether there is a hard error on the basis of the determination result transferred from the memory controller 3. In a case there is a hard error, the memory controller specifies a bit with a hard error.

Subsequently, the memory controller 3 performs the shift read (Step S108). The shift amount of the read voltage in the shift read of Step S108 is small compared to the rough shift read of Step S104.

Further, the process of determining the hard error of Step S107 may be performed after the shift read of Step S108. In addition, the process of determining the hard error of Step S107 may be performed before the BCH correction of Step S102.

As a determination result of Step S107, in a case where there is no hard error (S109=No), the second ECC circuit 15B performs the correction process using the LDPC code (Step S110). In a case where the error correction is successful (S112=Yes), the read operation in this time is ended.

In a case where the error correction is not successful (S112=No), the memory controller 3 transfers a status indicating a read error to the host device 4 for example (Step S113).

On the other hand, as a determination result of Step S107, in a case where there is a hard error (S109=Yes), the second ECC circuit 15B performs the LDPC correction using the read data except the defective bit (Step S111). In other words, the second ECC circuit 15B performs a decoding calculation using the read data except the defective bit. Information of the defective bit is contained in the determination result of Step S109. With this configuration, the normal distribution can be obtained in the LDPC correction with higher accuracy, so that it is possible to improve correction accuracy.

Thereafter, the process proceeds to Step S112.

[3-3-1] Hard Error Determination Operation

When receiving a command to designate an operation of determining the hard error from the memory controller 3, the NAND flash memory 2 performs a hard error determination operation.

Figure 20:
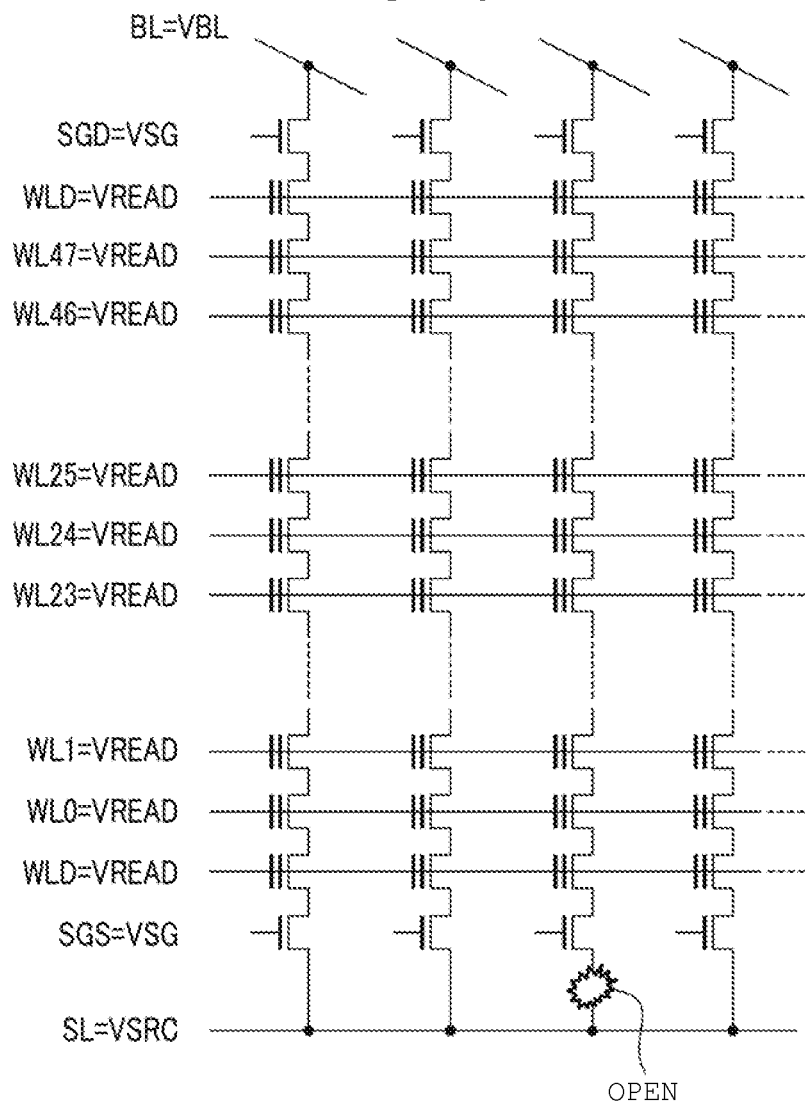
FIG. 20 is a diagram for describing a hard error determination operation in the presence of an open failure.

FIG. 20 is a diagram for describing the hard error determination operation of the NAND flash memory 2. The hard error determination operation is an operation in which the non-select read voltage VREAD is applied to all the word lines of the read-target string unit SU, and it is determined whether a current flows to the NAND string NS (the NAND string NS is in the ON state).

As illustrated in FIG. 20, the row decoder 26 applies the non-select read voltage VREAD to all the word lines of the read-target string unit SU. A voltage relation other than all the word lines is the same as the operation of the normal read described above.

With this configuration, for example, a current does not flow to the NAND string NS where the open failure occurs, and the defective NAND string NS enters the OFF state. The sense amplifier unit 28 detects a voltage of the bit line BL to determine a bit of the defective NAND string NS where the hard error occurs. The determination result is transferred to the memory controller 3.

Further, the non-select read voltage using the hard error determination operation may be not equal to the voltage VREAD, and may be any voltage. With this configuration, it is possible to appropriately adjust a detection level and power consumption. In addition, the voltage of the bit line used in the hard error determination operation may be not equal to the voltage VBL at the time of the normal read, and may be any voltage. With this configuration, it is possible to appropriately adjust a detection level and power consumption.

[3-3-2] Shift Read

Figure 21:
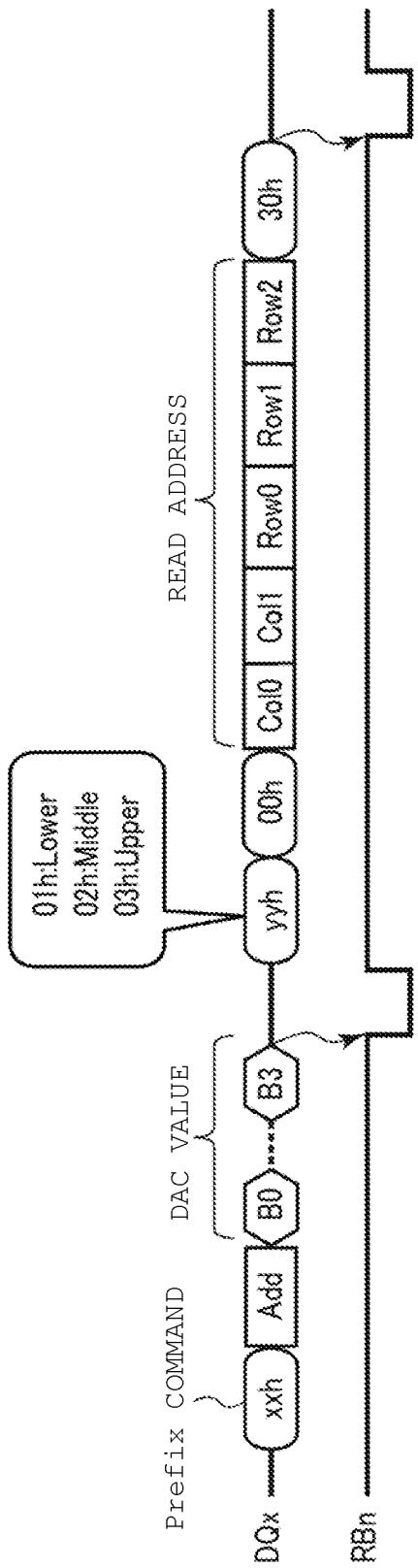
FIG. 21 is a timing chart for describing a shift read.

FIG. 21 is a timing chart for describing the shift read.

The memory controller 3 transfers a command sequence of "<xxh> <Add> <B0> . . . <B3>" to the NAND flash memory 2. A prefix command "xxh" is a command to set parameters such as various types of voltages and operation timings in the NAND flash memory 2. "Add" indicates an address. Data "B0" to "B3" are DAC (D/A converter) values ΔDAC1 to ΔDAC4 corresponding to the shift amount of the read voltage. The values ΔDAC1 to ΔDAC4 correspond respectively to shift amounts ΔV1 to ΔV4 from the read voltage which are applied to first to fourth selected word lines WL in the shift read.

As illustrated in FIG. 6, for example, the data of the middle page is determined using the read voltages VB, VD, and VF of States "B", "D", and "F". In a case where the values ΔDAC1 to ΔDAC3 are designated in the shift read of the middle page, the read voltages VB, VD, and VF are expressed using the shift amounts ΔV1 to ΔV3 as follows.

$$VB = VB\text{def} + \Delta V1$$

$$VD = VD\text{def} + \Delta V2$$

$$VF = VF\text{def} + \Delta V3$$

The voltages VBdef, VDdef, and Vfdef are initial setting values.

The shift amounts ΔV1 to ΔV4 are different in the rough shift read of Step S104 and the shift read of Step S108 in FIG. 19. In other words, the shift amount in the shift read of Step S108 is smaller than that in the rough shift read of Step S104.

When receiving the prefix command "xxh" from the memory controller 3, the NAND flash memory 2 sets the ready/busy signal RBn to the low level. Then, the NAND flash memory 2 performs an internal setting operation corresponding to the prefix command "xxh".

Subsequently, the memory controller 3 transfers a command sequence of "<yyh> <00h> <Col0> <Col1> <Row0> <Row1> <Row2> <30h>" to the NAND flash memory 2. The command "yyh" is a variable and a command to designate any one of the lower page, the middle page, and the upper page. For example, in the case of "yyh"="01h", the lower page read is designated, in the case of "yyh"="02h", the middle page read is designated, and in the case of "yyh"="03h", the upper page read is designated. Read commands "00h" and "30h" are commands to designate the read operation. A sequence of "<Col0> <Col1> <Row0> <Row1> <Row2>" is a read address in which "Col" is a column address, and "Row" is a row address.

When receiving the read command "30h" from the memory controller 3, the NAND flash memory 2 sets the ready/busy signal RBn to the low level. Then, the NAND flash memory 2 reads out data from the page corresponding to the memory cell array 20 using the read address. The page read out of the memory cell array 20 is stored in the data register 29. When the read operation of the data is ended, the NAND flash memory 2 sets the ready/busy signal RBn to the high level.

Thereafter, the memory controller 3 issues a command to output data at any timing to the NAND flash memory 2, and outputs the read data stored in the data register 29.

Further, the command sequence of the normal read described above is the same as the latter half (a portion after the command "yyh") of the command sequence of the shift read.

[4] Effects of Embodiments

As described above, in the embodiments, the memory controller 3 includes the first ECC circuit 15A which performs the BCH correction, and the second ECC circuit 15B which performs the LDPC correction having a higher error correction capability than the first ECC circuit 15A. The first ECC circuit 15A corrects an error of the read data which is read out of the NAND flash memory 2. In a case where the first ECC circuit 15A is not possible to correct the error, the memory controller 3 determines whether the hard error occurs in the memory cell array 20. In a case where the hard error occurs in the memory cell array 20, the second ECC circuit 15B performs the error correction using the second read data except a bit where the hard error occurs. On the other hand, in a case where the hard error does not occur in the memory cell array 20, the second ECC circuit performs the error correction using the read data which is read out of the NAND flash memory 2.

Therefore, according to the embodiments, it is possible to estimate the normal distribution in the LDPC correction with accuracy compared to that obtained by using a likelihood. With this configuration, it is possible to achieve the memory system which can prevent the error correction efficiency from being lowered.

In addition, the hard error is determined at every read operation. Therefore, the memory controller 3 does not need to store defective information for a long time. In addition, there is no need to manage a block with the hard error as a defective block. As a result, a load on the memory controller 3 can be reduced, and information amount to be managed by the memory controller 3 can be reduced.

In addition, a block with the hard error is not managed as a defective block, but the block with the hard error can be used without any change. With this configuration, a storage capacitance of the NAND flash memory 2 can be prevented from being reduced.

In addition, in the operation of determining the hard error, the read operation is performed by applying the non-select read voltage VREAD to all the word lines. In other words, it is possible to determine the hard error in a time of reading one page of data. With this configuration, it is possible to prevent the reading performance from being degraded.

[5] Other Modifications

Further, the above embodiments have been described using an example in a case where one memory cell transistor stores 3-bit data, but the present disclosure is not limited thereto. For example, one memory cell transistor may store 1-bit data (SLC: Single level Cell), 2-bit data (MLC: Multilevel Cell), or 4-bit data or more. Even in those examples, the various types of operations described in the above embodiments can be realized.

In the above embodiments, the description has been given about an example where the NAND flash memory includes the plurality of memory cells which is three-dimensionally stacked. However, the present disclosure is not limited to such a configuration, and the NAND flash memory may include the plurality of memory cells which is two-dimensionally arranged.

In the above embodiments, the description has been given about an example in a case where a MONOS film is used in the memory cell, but the present disclosure is not limited thereto. For example, a floating gate type of memory cell may be used.

In this specification, the "connection" indicates an electrical connection. For example, it is not excluded that two elements are connected through another element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
   a nonvolatile memory including:
      a memory cell array that includes a plurality of memory strings and a plurality of word lines, wherein each of the plurality of memory strings includes first and second select transistors and a plurality of memory cell transistors that are connected in series between the first and second select transistors, and the plurality of word lines is connected to the plurality of memory cell transistors, respectively, in each of the plurality of memory strings; and
      a control circuit configured to control voltages of the plurality of word lines; and
   a memory controller which includes a first error checking and correcting (ECC) circuit and a second ECC circuit having a higher error correction capability than the first ECC circuit, and is configured to perform ECC operation on data read from the nonvolatile memory using the first ECC circuit and the second ECC circuit,
   wherein during the ECC operation,
      the first ECC circuit operates to correct an error in first read data which is read out from the nonvolatile memory,
      in a case where the first ECC circuit is unable to correct the error, the memory controller determines whether or not a hard error occurs in one of the plurality of memory strings based on current flow or non-current flow through the one of the plurality of memory strings when the control circuit applies a first voltage to the plurality of word lines to turn on memory cell transistors of the one of the plurality of memory strings, and
      in a case where the hard error occurs in the one of the plurality of memory strings, the second ECC circuit performs error correction on second read data that excludes data stored in the one of the plurality of memory strings where the hard error occurs.

2. The memory system according to claim 1, wherein during the ECC operation,
   in a case where the hard error does not occur, the second ECC circuit performs the error correction using the first read data.

3. The memory system according to claim 1, wherein the first ECC circuit performs a hard decision decoding, and
   the second ECC circuit performs a soft decision decoding.

4. The memory system according to claim 3, wherein the first ECC circuit performs decoding using a Bose-Chaudhuri-Hocquenghem (BCH) code, and
   the second ECC circuit performs decoding using a Low-Density Parity Check (LDPC) code.

5. The memory system according to claim 1, wherein the control circuit determines, as a location of the hard error, the one of the plurality of memory strings if no current flows when the control circuit applies the first voltage to the plurality of word lines, and transfers the determined location to the memory controller.

6. The memory system according to claim 1, wherein in each of the plurality of memory strings, the plurality of memory cell transistors are stacked in a vertical direction, and share a column-like semiconductor channel.

7. The memory system according to claim 1, wherein the memory controller performs a first shift read to obtain the first read data and a second shift read to obtain the second read data.

8. The memory system according to claim 7, wherein a shift amount of the read voltage is larger in the first shift read than in the second shift read.

9. The memory system according to claim 1, wherein the memory controller determines whether the hard error occurs in the one of the plurality of memory strings when the first ECC circuit cannot correct the error in the first read data after performing a normal read of the first read data and a shift read of the first read data.

10. A method of performing error checking and correcting (ECC) operation on data read from a nonvolatile memory which includes a memory cell array that includes a plurality of memory strings and a plurality of word lines, wherein each of the plurality of memory strings includes first and second select transistors and a plurality of memory cell transistors that are connected in series between the first and second select transistors, and the plurality of word lines is connected to the plurality of memory cell transistors, respectively, in each of the plurality of memory strings, said method comprising:

performing a first ECC operation with a first ECC circuit to correct an error in first read data that is read out from the nonvolatile memory;

in a case where the first ECC circuit is unable to correct the error, determining whether or not a hard error occurs in one of the plurality of memory strings based on current flow or non-current flow through the one of the plurality of memory strings when a first voltage is applied to the plurality of word lines to turn on memory cell transistors of the one of the plurality of memory strings; and in a case where the hard error occurs in the one of the plurality of memory strings, performing a second ECC operation with a second ECC circuit on second read data that excludes data stored in the one of the plurality of memory strings where the hard error occurs, wherein the second ECC circuit has a higher error correction capability than the first ECC circuit.

11. The method according to claim 10, further comprising:

in a case where hard error does not occur, performing the second ECC operation using the first read data.

12. The method according to claim 10, wherein the first ECC circuit performs a hard decision decoding, and the second ECC circuit performs a soft decision decoding.

13. The method according to claim 12, wherein the first ECC circuit performs decoding using a Bose-Chaudhuri-Hocquenghem (BCH) code, and the second ECC circuit performs decoding using a Low-Density Parity Check (LDPC) code.

14. The method according to claim 10, further comprising:

determining, as a location of the hard error, the one of the plurality of memory strings if no current flows when the control circuit applies the first voltage to the plurality of word lines; and transferring the determined location for use by the second ECC circuit.

15. The method according to claim 10, wherein in each of the plurality of memory strings, the plurality of memory cell transistors are stacked in a vertical direction, and share a column-like semiconductor channel.

16. The method according to claim 10, further comprising:

performing a first shift read to obtain the first read data and a second shift read to obtain the second read data.

17. The method according to claim 16, wherein a shift amount of the read voltage is larger in the first shift read than in the second shift read.

18. The method according to claim 10, wherein determination of the hard error is performed when the first ECC circuit cannot correct the error in the first read data after performing a normal read of the first read data and a shift read of the first read data.

* * * * *